(12) United States Patent
Shintani et al.

(10) Patent No.: US 8,736,746 B2
(45) Date of Patent: May 27, 2014

(54) IMAGING DEVICE

(75) Inventors: Dai Shintani, Osaka (JP); Koji Shibuno, Osaka (JP)

(73) Assignee: Panasonic Corporation, Osaka (JP)

( * ) Notice: Subject to any disclaimer, the term of this patent is extended or adjusted under 35 U.S.C. 154(b) by 346 days.

(21) Appl. No.: 13/071,506

(22) Filed: Mar. 25, 2011

(65) Prior Publication Data
US 2011/0234884 A1 Sep. 29, 2011

(30) Foreign Application Priority Data

Mar. 26, 2010 (JP) ................................. 2010-073775

(51) Int. Cl.
G03B 13/00 (2006.01)
H04N 5/232 (2006.01)
(52) U.S. Cl.
USPC ........... 348/356; 348/345; 348/353; 396/119; 257/228
(58) Field of Classification Search
USPC .......... 348/353, 354, 356, 262, 345; 396/119; 382/255; 257/228
See application file for complete search history.

(56) References Cited

U.S. PATENT DOCUMENTS

| 4,675,535 A | 6/1987 | Tsunekawa et al. |
| 2009/0146045 A1 | 6/2009 | Yamaguchi |
| 2009/0322918 A1 | 12/2009 | Shintani |

FOREIGN PATENT DOCUMENTS

| JP | S61-135280 A | 6/1986 |
| JP | H2-1478226 A | 6/1990 |
| JP | 2006-161089 A | 6/2006 |
| JP | 2007-135140 A | 5/2007 |
| JP | 2007-163545 A | 6/2007 |
| JP | 2007-293010 A | 11/2007 |
| JP | 2007-306093 A | 11/2007 |
| JP | 2009-017079 A | 1/2009 |
| JP | 2009-159593 A | 7/2009 |
| WO | WO-2009-022458 A | 2/2009 |

OTHER PUBLICATIONS

Office Action for the corresponding Japanese Patent Application No. 2010-073775, dated Nov. 20, 2012.
Office Action for the corresponding Japanese Patent Application No. 2010-073775, dated Apr. 24, 2012.

*Primary Examiner* — Paul Berardesca
(74) *Attorney, Agent, or Firm* — Shinjyu Global IP

(57) ABSTRACT

An imaging device is provided that includes a first imaging element, a second imaging element, and a focal point detector. The first imaging element includes a first opto-electrical converter configured to convert light into an electrical signal. The second imaging element is configured and arranged to receive light incident on and passing through the first opto-electrical converter. The second imaging element includes a second opto-electrical converter configured to convert the light coming from the first opto-electrical converter into an electrical signal. The focal point detector is configured to perform focal point detection based on first image data obtained by the first imaging element and second image data obtained by the second imaging element.

18 Claims, 24 Drawing Sheets

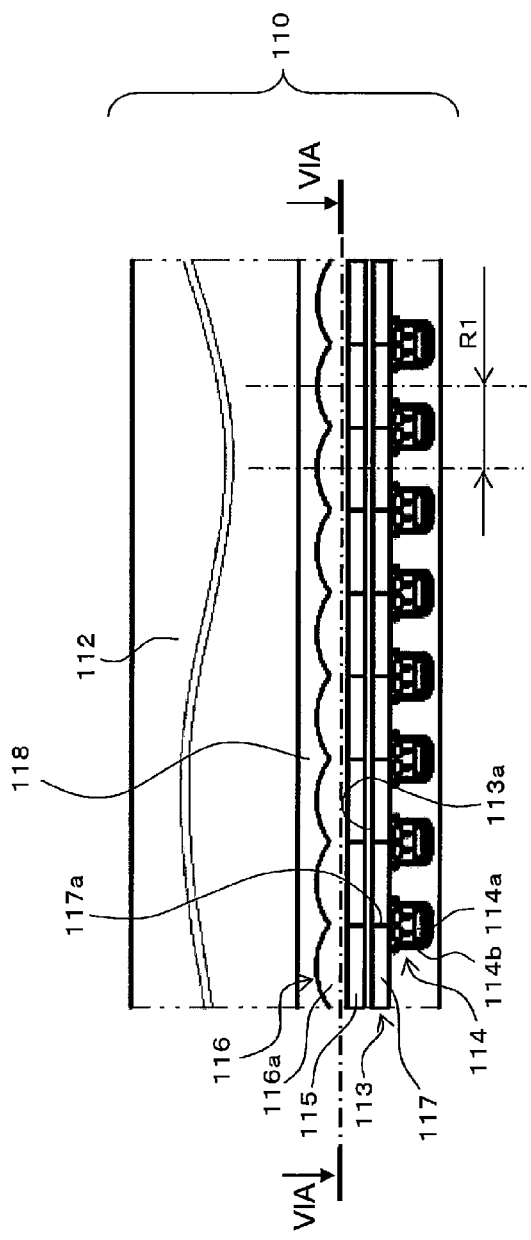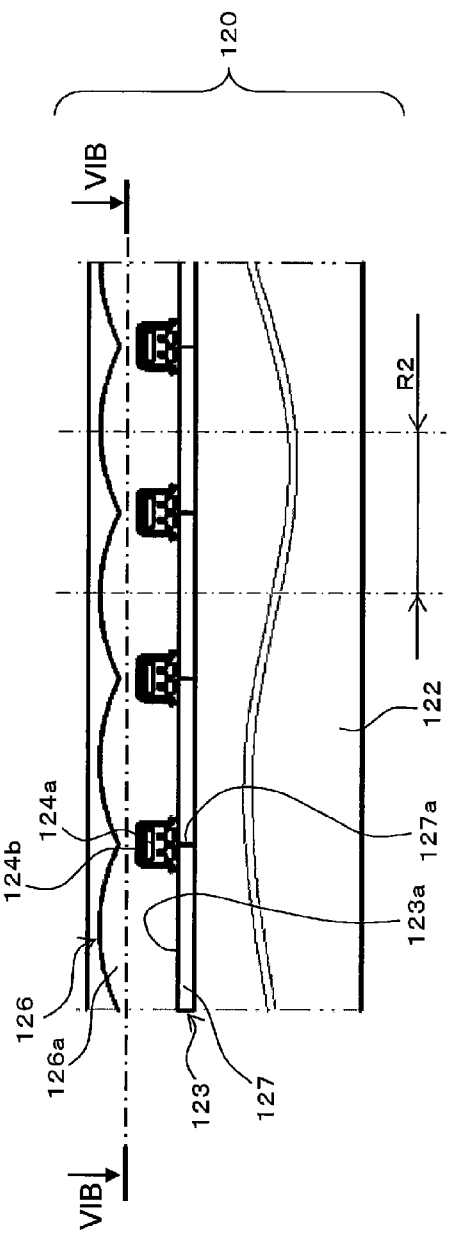
FIG. 4A
FIG. 4B

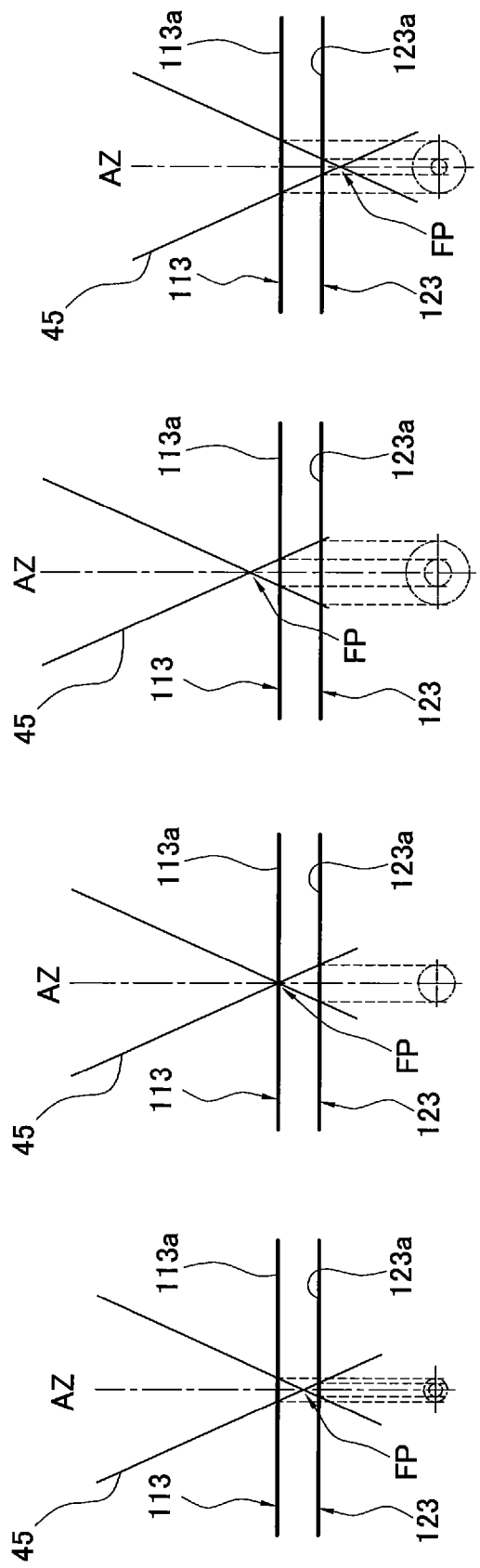

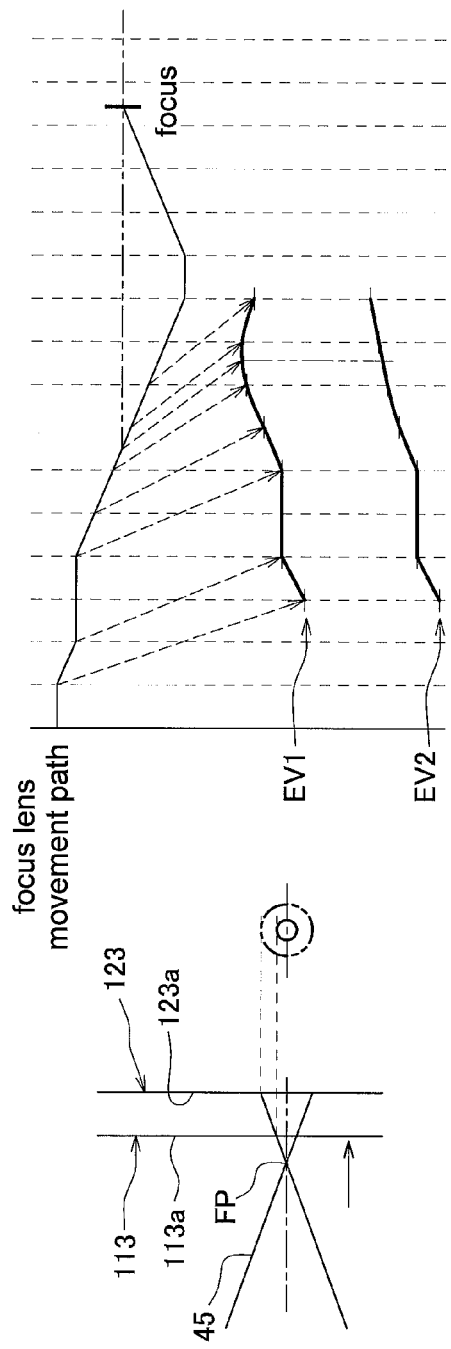
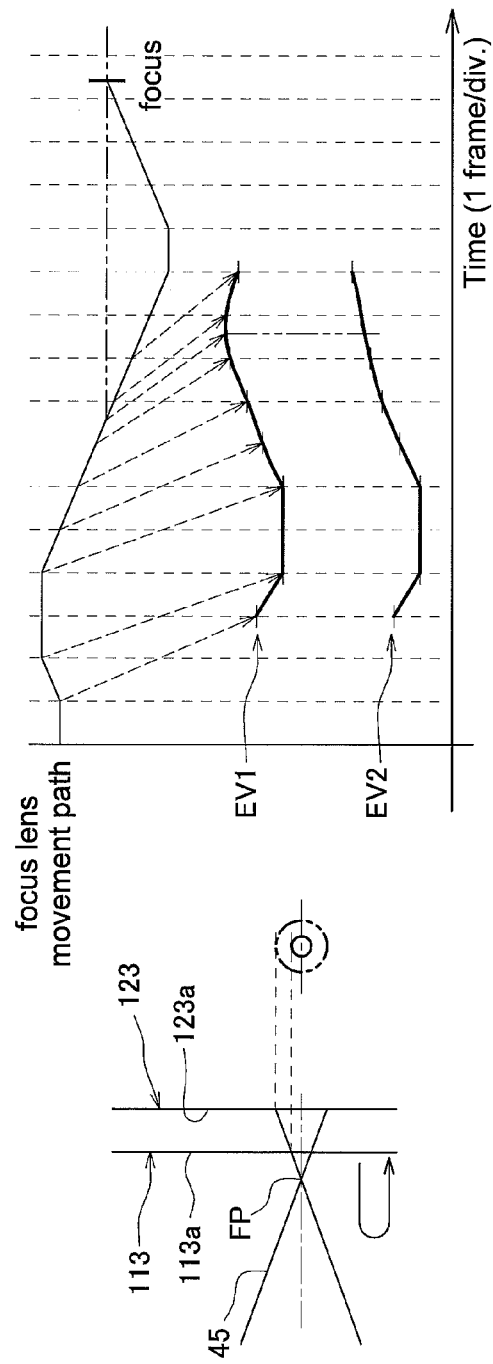

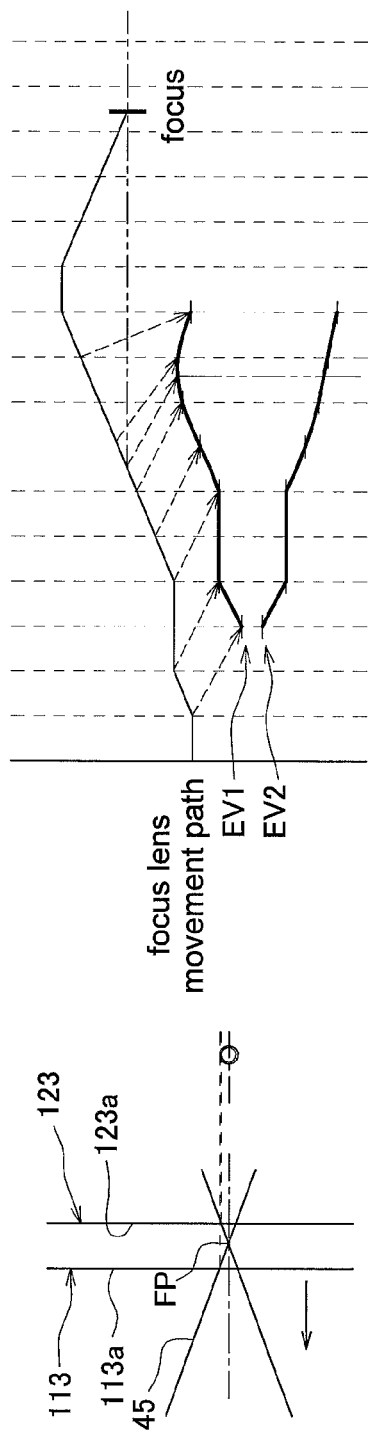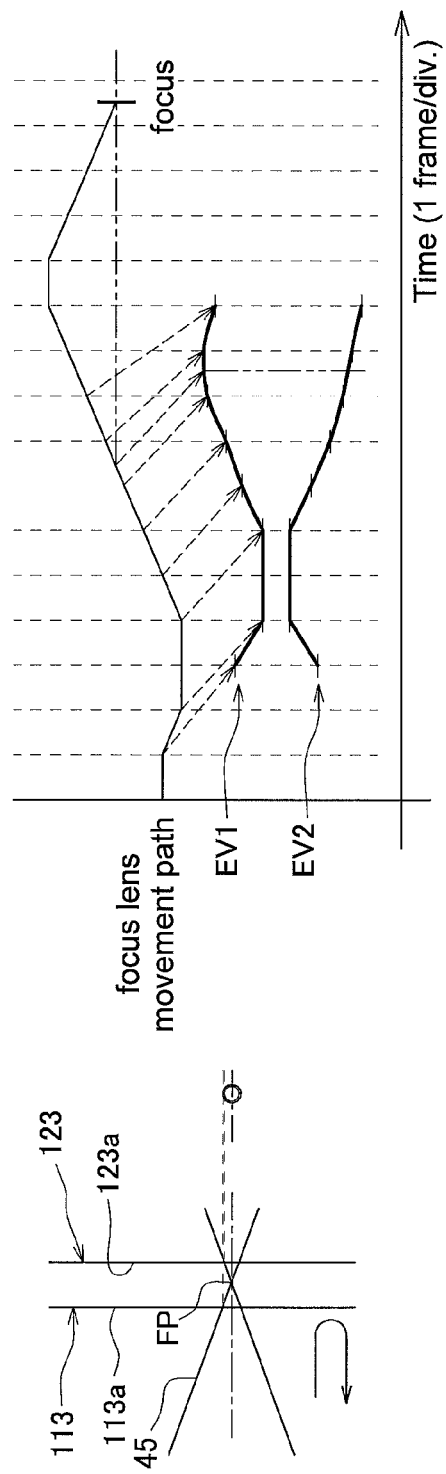
FIG. 9A
FIG. 9B

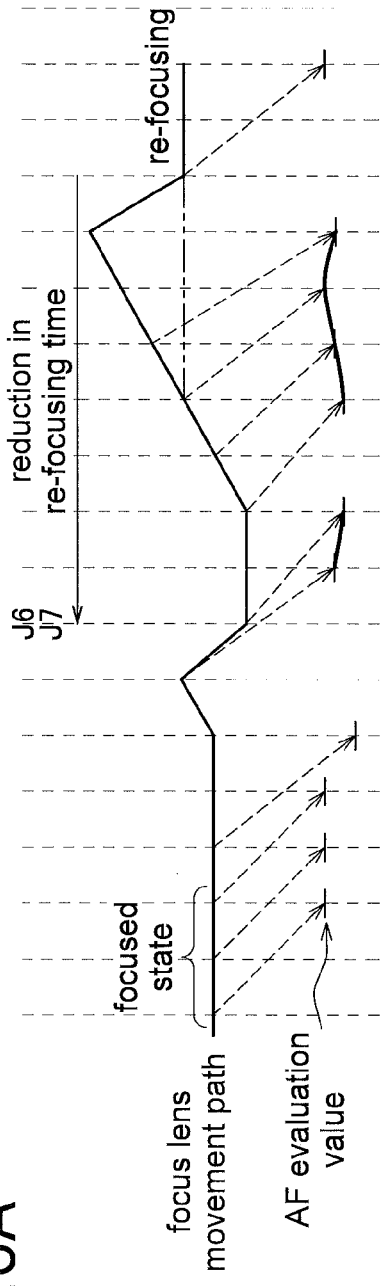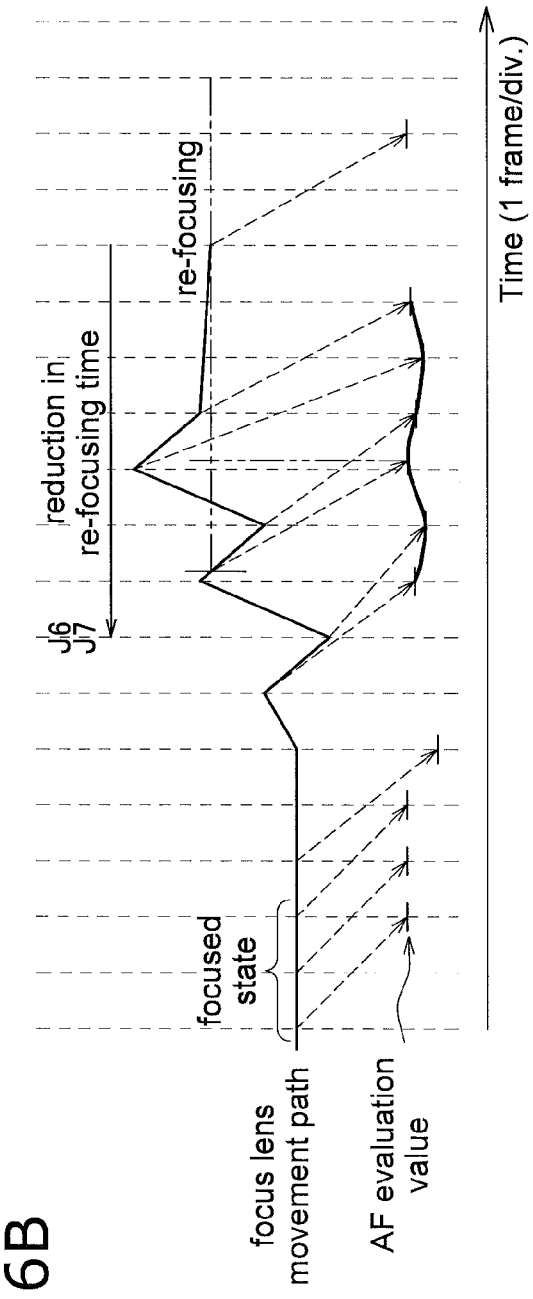

IMAGING DEVICE

CROSS-REFERENCE TO RELATED APPLICATIONS

This application claims priority to Japanese Patent Application No. 2010-073775 filed on Mar. 26, 2010. The entire disclosure of Japanese Patent Application No. 2010-073775 is hereby incorporated herein by reference.

BACKGROUND

1. Technical Field

The technology disclosed herein relates to an imaging device having a focal point detecting function.

2. Background Information

Digital cameras that make use of a CCD (charge coupled device) image sensor, a CMOS (complementary metal oxide semiconductor) image sensor, or another such imaging element to convert an optical image into an electrical signal and digitize the electrical signal have become very popular in recent years.

Cameras that employ a phase difference detection type of autofocusing function (AF function) are a known type of digital single-lens reflex camera. With a phase difference detection type of autofocusing function, the defocus direction and the defocus amount can be detected without moving the focus lens, so the focus lens can be moved to the focal position and the time it takes for autofocusing can be reduced (see Japanese Laid-Open Patent Application 2007-163545, for example). With a conventional digital single-lens reflex camera, a movable mirror is provided in order to guide an optical image of the subject to the phase difference detection unit. This movable mirror is provided so that it can be inserted into and retracted out of the optical path from the lens barrel to the imaging element.

Meanwhile, a contrast detection type of autofocusing function (also called contrast AF), featuring an imaging element and a viewfinder function constituted by an EVF (electronic viewfinder) or an LCD (liquid crystal display) in what is known as a compact digital camera, has been employed to reduce the size of a digital camera (see Japanese Laid-Open Patent Application 2007-135140, for example). This contrast AF directly detects the focus at the imaging plane, so an advantage is that it is generally more accurate than phase difference detection autofocusing.

With the contrast AF discussed in Japanese Laid-Open Patent Application 2007-135140, an evaluation value is calculated from image data produced by an imaging element, and the position of the focus lens at which this evaluation value is greatest is considered to be the focal position.

However, since only the evaluation value obtained from a single imaging element is used as a reference, the focus lens must be driven for a relatively long time to determine an increase or decrease in the evaluation value. Accordingly, contrast AF takes a relatively long time, which means that focal point detection takes longer.

SUMMARY

An imaging device is disclosed herein that includes a first imaging element, a second imaging element, and a focal point detector. The first imaging element includes a first opto-electrical converter configured to convert light into an electrical signal. The second imaging element is configured and arranged to receive light incident on and passing through the first opto-electrical converter. The second imaging element includes a second opto-electrical converter configured to convert the light coming from the first opto-electrical converter into an electrical signal. The focal point detector is configured to perform focal point detection based on first image data obtained by the first imaging element and second image data obtained by the second imaging element.

These and other objects, features, aspects and advantages of the technology disclosed herein will become apparent to those skilled in the art from the following detailed description, which, taken in conjunction with the annexed drawings, discloses embodiments of the present invention.

BRIEF DESCRIPTION OF DRAWINGS

Referring now to the attached drawings which form a part of this original disclosure:

FIG. 4A is a simplified cross section of a first imaging element, and FIG. 4B is a simplified cross section of a second imaging element;

FIG. 7A shows a first rear focus state, FIG. 7B a focused state, FIG. 7C a front focus state, and FIG. 7D a second rear focus state;

FIG. 8A is a focal point detection time chart in a front focus state when the drive direction of the focus lens is not inverted, and FIG. 8B is a focal point detection time chart in a front focus state when the drive direction of the focus lens is inverted;

FIG. 9A is a focal point detection time chart in a first rear focus state when the drive direction of the focus lens is not inverted, and FIG. 9B is a focal point detection time chart in a first rear focus state when the drive direction of the focus lens is inverted;

FIG. 16 is a time chart (reference example);

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment

Configuration of Digital Camera

A digital camera 1 pertaining to a first embodiment will be described through reference to FIG. 1.

The digital camera 1 is an interchangeable lens type of digital camera, and has an interchangeable lens unit 2 and a camera body 3.

(1) Interchangeable Lens Unit

Figure 1:
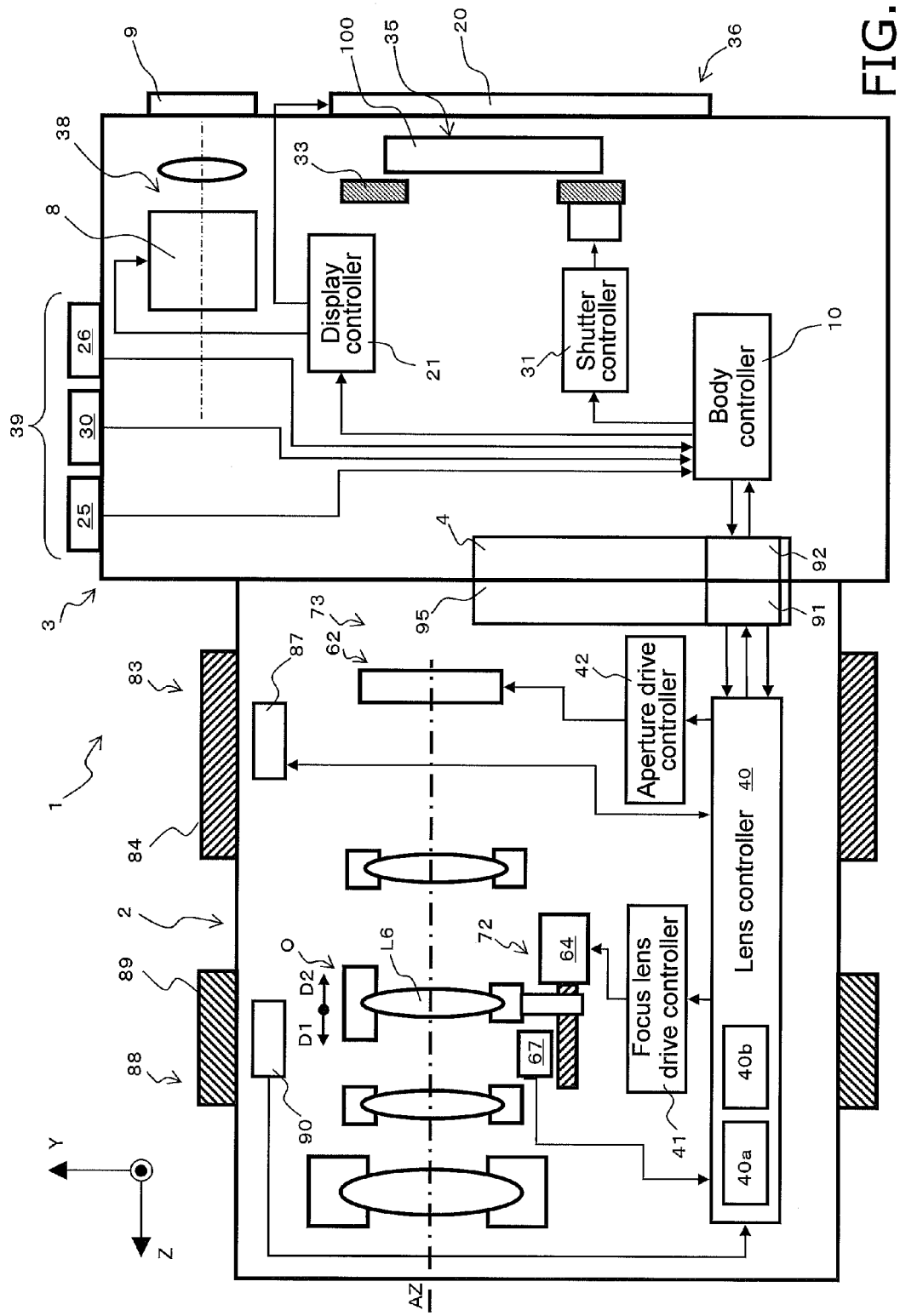
FIG. 1 is a simplified diagram of the configuration of a digital camera.

As shown in FIG. 1, the interchangeable lens unit 2 has a lens mount 95, an optical system O, an aperture adjusting unit 73, a lens controller 40, a zoom ring unit 83, a focus ring unit 88, and a focus adjusting unit 72.

The lens mount 95 is provided such that it can be mounted to a body mount 4 of the camera body 3, and has a lens-side contact 91. The optical system O is a zoom lens system, for example, and has a focus lens L.

The aperture adjusting unit 73 has an aperture unit 62 and an aperture drive controller 42. The aperture unit 62 includes an aperture mechanism (not shown) having aperture blades, and an aperture drive motor (not shown) that drives the aperture mechanism, and is provided so that the aperture value of the optical system O can be varied. The aperture drive controller 42 controls the aperture unit 62 on the basis of a command sent from the lens controller 40.

The lens controller 40 has a CPU (not shown), a ROM 40b, and a RAM 40a, and various functions can be performed by reading programs stored in the ROM 40b into the CPU. For instance, the lens controller 40 can ascertain the absolute position of the focus lens L by using a detection signal from a position detection sensor 67. The ROM 40b is a nonvolatile memory, and can hold stored information even when the power supply has been halted. Information related to the interchangeable lens unit 2 (lens information) is held in the ROM 40b. The lens controller 40 is able to exchange information with a body controller 10 via the lens-side contact 91.

The zoom ring unit 83 has a zoom ring 84 and a linear position sensor 87. The linear position sensor 87 detects the rotational position and rotational direction of the zoom ring 84 when operated by the user, and sends the detection result at a specific period to the lens controller 40. The lens controller 40 calculates the focal distance of the optical system O on the basis of the detection result from the linear position sensor 87, and sends the calculated focal distance information to the body controller 10. Thus, the body controller 10 can ascertain the focal distance of the optical system O.

The focus ring unit 88 has a focus ring 89 and a focus ring angle detector 90. The focus ring angle detector 90 detects the rotational angle and the rotational direction of the focus ring 89, and sends the detection result to the lens controller 40. In manual focus mode, the lens controller 40 sends the detection result of the focus ring angle detector 90 to a focus drive controller 41, and the focus drive controller 41 controls a focus motor 64 (discussed below) on the basis of this detection result.

The focus adjusting unit 72 drives the focus lens L according to the operation of the focus ring 89 or the amount of defocus. The focus adjusting unit 72 has the focus motor 64, the position detection sensor 67, and the focus drive controller 41. The focus motor 64 drives the focus lens L in the direction of the optical axis AZ. Hereinafter, the directions in which the focus lens L is driven will be referred to as the D1 direction (subject side) and D2 direction (imaging element unit 100 side). The position detection sensor 67 detects the position of the focus lens L. The focus drive controller 41 controls the focus motor 64 on the basis of a command from the lens controller 40.

(2) Camera Body

Figure 2:
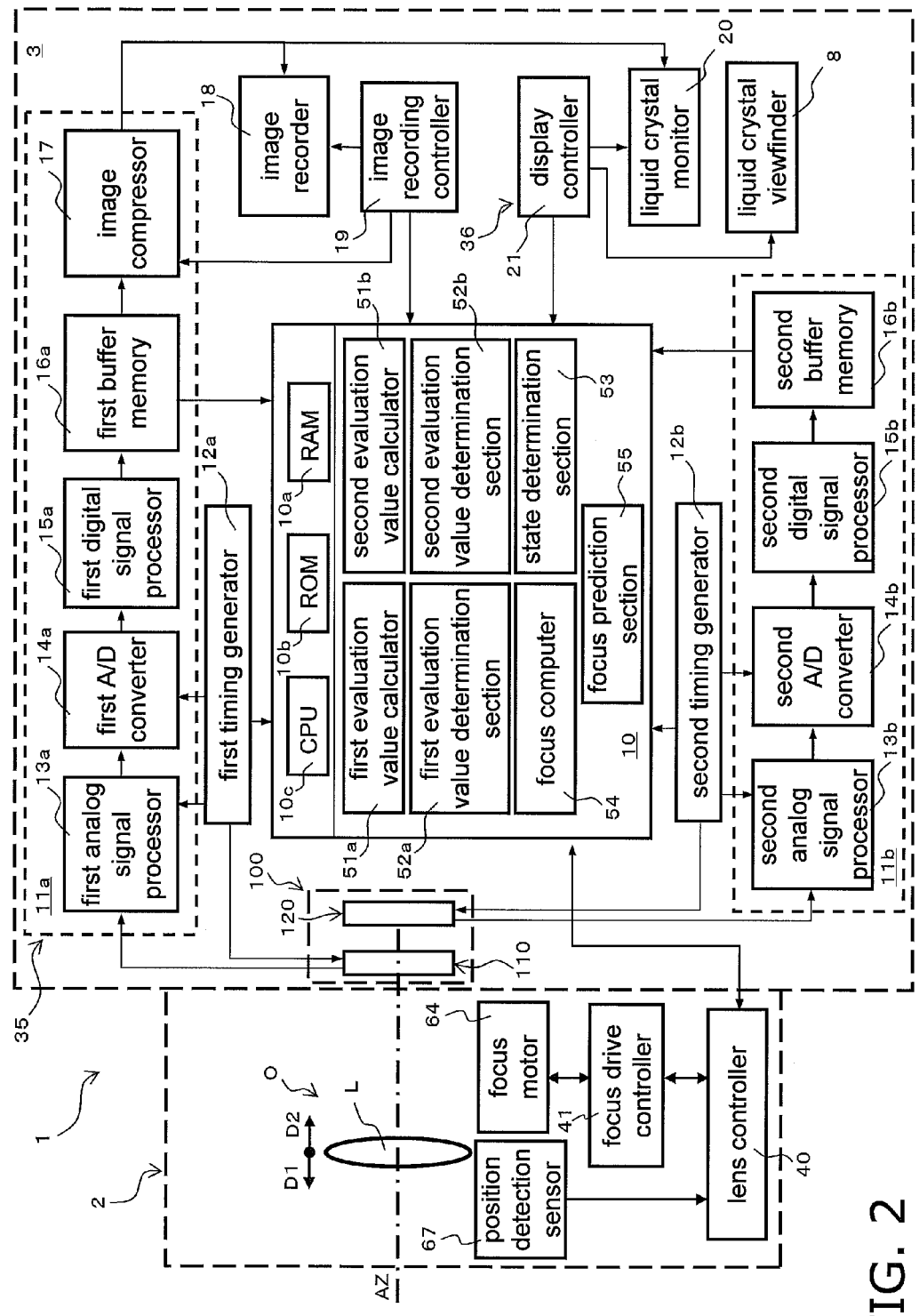
FIG. 2 is a simplified block diagram of a digital camera.

As shown in FIGS. 1 and 2, the camera body 3 has the body mount 4, an image acquisition component 35, a display unit 36, a viewfinder unit 38, a manipulation unit 39, the body controller 10, an image recorder 18, an image recording controller 19, and a display controller 21.

As shown in FIG. 1, the body mount 4 is the portion of the interchangeable lens unit 2 to which the lens mount 95 is mounted, and has a body-side contact 92 that can be electrically connected to the lens-side contact 91. The camera body 3 can exchange data with the interchangeable lens unit 2 via the body mount 4 and the lens mount 95. For instance, the body controller 10 sends the lens controller 40 an exposure synchronization signal or other such control signal via the body mount 4 and the lens mount 95. Also, the lens controller 40 sends the body controller 10 lens information related to the interchangeable lens unit 2 via the body mount 4 and the lens mount 95.

As shown in FIG. 1, the manipulation unit 39 has a power switch 25, a release button 30, and an imaging mode dial 26. The power switch 25 is provided to turn on and off the power supply to the digital camera 1 or the camera body 3. The release button 30 is a two-stage switch that can be pressed half-way down or all the way down, and is operated by the user during imaging. The body controller 10 can detect whether the release button 30 has been pressed half-way down or all the way down. If the user presses the release button 30 half-way down, this starts light metering, ranging, and focal point detection processing, for example. If the user presses the release button 30 all the way down, image data about the subject is acquired by the image acquisition component 35.

The imaging mode dial 26 is provided to switch whether or not the imaging is done in what is called live view mode. The user can operate the imaging mode dial 26 to select whether to perform imaging by looking into a viewfinder eyepiece window 9 or while looking at a liquid crystal monitor 20.

As shown in FIGS. 1 and 2, the image acquisition component 35 has the imaging element unit 100, a shutter unit 33, a shutter controller 31, a first image processor 11a, a second image processor 11b, a first timing generator 12a, and a second timing generator 12b.

As shown in FIG. 2, the imaging element unit 100 has a first imaging element 110 and a second imaging element 120. The first imaging element 110 and the second imaging element 120 are CMOS image sensors, for example, that convert an optical image formed by the optical system O into an electrical signal. The first imaging element 110 and the second imaging element 120 may instead be CCD image sensors. The imaging element unit 100 will be discussed in detail below.

As shown in FIG. 1, the shutter unit 33 adjusts the exposure state of the imaging element unit 100. The shutter controller 31 controls the shutter unit 33 on the basis of a command from the body controller 10. The shutter unit 33 and the shutter controller 31 are used to adjust the exposure time.

As shown in FIG. 2, the first image processor 11a subjects an electrical signal outputted from the first imaging element 110 to specific image processing. The second image processor 11b subjects an electrical signal outputted from the second imaging element 120 to specific image processing. Hereinafter, one frame of image data outputted from the first image processor 11a will be called first image data, and one frame of image data outputted from the second image processor 11b will be second image data. The first image processor 11a and second image processor 11b will be discussed in detail below. The first timing generator 12a generates a timing signal for driving the first imaging element 110. The second timing generator 12b generates a timing signal for driving the second imaging element 120. In this embodiment, the frame rate of the first imaging element 110 and the second imaging element 120 is 30 fps. The first imaging element 110 and the second imaging element 120 are synchronized so that charges are outputted at the same timing.

The autofocusing method employed with the digital camera 1 is the contrast detection method (also called contrast AF), which utilizes image data produced by the imaging element unit 100. Very accurate focus adjustment can be accomplished with a contrast detection method.

The body controller 10 is a control device that is the command center of the camera body 3, and controls the various components of the digital camera 1 according to manipulation information inputted to the manipulation unit 39. More specifically, as shown in FIG. 2, the body controller 10 is equipped with a CPU 10c, a ROM 10b, and a RAM 10a, and the programs held in the ROM 10b are read by the CPU, allowing the body controller 10 to perform a variety of functions. For instance, the body controller 10 has a computation processing function for autofocusing.

More specifically, as shown in FIG. 2, the body controller 10 has a first evaluation value calculator 51a (one example of a first calculator), a second evaluation value calculator 51b (one example of a second calculator), a first evaluation value determination section 52a (one example of a first determination section), a second evaluation value determination section 52b (one example of a second determination section), a state determination section 53, a focus computer 54, and a focus prediction section 55. These components indicate the function blocks realized by a program.

The first evaluation value calculator 51a calculates a first evaluation value EV1 on the basis of first image data obtained by the first imaging element 110. The first evaluation value EV1 is an AF evaluation value used in contrast AF. The term "AF evaluation value" here is a numerical value obtained by integrating the high-frequency components out of the spatial frequency component of the image data. The first image data is data recorded to a first buffer memory 16a. The first evaluation value calculator 51a calculates the first evaluation value EV1 at a period that is the same as the frame rate of the first imaging element 110. The first evaluation value EV1 thus calculated is associated with position information about the focus lens L detected at the same timing, and is temporarily stored in the RAM 10a of the body controller 10.

The second evaluation value calculator 51b calculates a second evaluation value EV2 on the basis of second image data obtained by the second imaging element 120. Just as with the first evaluation value EV1, the second evaluation value EV2 is an AF evaluation value used in contrast AF. The second image data is stored in a second buffer memory 16b. The second evaluation value calculator 51b calculates the second evaluation value EV2 at a period that is the same as the frame rate of the second imaging element 120. The second evaluation value EV2 thus calculated is associated with position information about the focus lens L detected at the same timing, and is temporarily stored in the RAM 10a of the body controller 10.

The first evaluation value determination section 52a monitors fluctuations in the first evaluation value EV1 at a specific period. More specifically, the first evaluation value determination section 52a determines at a specific period the increase or decrease in the first evaluation value EV1, and produces at a specific period a first determination result indicating the increase or decrease in the first evaluation value EV1. For example, the first evaluation value determination section 52a compares the newest first evaluation value EV1 with the immediately prior first evaluation value EV1, and determines whether the newest first evaluation value EV1 has increased or decreased from the immediately prior first evaluation value EV1. This first determination result is temporarily stored in the RAM 10a.

The second evaluation value determination section 52b monitors fluctuations in the second evaluation value EV2 at a specific period. More specifically, the second evaluation value determination section 52b determines at a specific period the increase or decrease in the second evaluation value EV2, and produces at a specific period a second determination result indicating the increase or decrease in the second evaluation value EV2. For example, the second evaluation value determination section 52b compares the newest second evaluation value EV2 with the immediately prior second evaluation value EV2, and determines whether the newest second evaluation value EV2 has increased or decreased from the immediately prior second evaluation value EV2. This second determination result is temporarily stored in the RAM 10a.

The state determination section 53 determines the imaging position of the light flux from the optical system O, and the positional relation between a first opto-electrical converter 113 and a second opto-electrical converter 123, on the basis of the first determination result and the second determination result. More precisely, the state determination section 53 determines the imaging position and the positional relation between the first opto-electrical converter 113 and the second opto-electrical converter 123 on the basis of a combination of the first determination result and the second determination result. That is, the state determination section 53 can determine which way the focus lens L should be driven to achieve focus. The determination method used by the state determination section 53 will be discussed below.

The focus computer 54 calculates the position of the focus lens L corresponding to the focal state on the basis of the first evaluation value EV1. More specifically, the focus computer 54 determines the peaks of the first evaluation value EV1 and second evaluation value EV2 on the basis of the first determination result and the second determination result. Furthermore, the focus computer 54 selects the first evaluation value EV1 corresponding to the peak, and selects a positional relation associated with the selected first evaluation value EV1. The selected position information expresses the position of the focus lens L in the focal state shown in FIG. 7B.

The focus prediction section 55 selects the second evaluation value EV2 corresponding to the peak when the peak of the second evaluation value EV2 is detected sooner than the peak of the first evaluation value EV1, and predicts the position of the focus lens L corresponding to the focal state using the selected second evaluation value EV2 as a reference. The prediction computation of the focus prediction section 55 will be discussed below.

As mentioned above, the body controller 10 has various functions related to focal point detection. The first evaluation value calculator 51a, the second evaluation value calculator 51b, the first evaluation value determination section 52a, the second evaluation value determination section 52b, the state determination section 53, the focus computer 54, and the focus prediction section 55 constitute a focal point detector that performs focal point detection on the basis of first image data obtained by the first imaging element 110 and second image data obtained by the second imaging element 120.

As shown in FIGS. 1 and 2, the display unit 36 has the liquid crystal monitor 20 and the display controller 21. The liquid crystal monitor 20 displays as a visible image an image signal recorded to a first image recorder 18a or the first buffer memory 16a on the basis of a command from the display controller 21. That is, an image based on the electrical signal produced by the first imaging element 110 is displayed on the liquid crystal monitor 20. Possible display modes on the liquid crystal monitor 20 include one in which only an image signal is displayed as a visible image, and one in which an image signal and information about when the image was captured are displayed as a visible image.

As shown in FIG. 1, the viewfinder unit 38 has a liquid crystal viewfinder 8 that displays images acquired by the first imaging element 110, and the viewfinder eyepiece window 9 provided to the rear face. The user looks into the viewfinder eyepiece window 9 to view an image displayed on the liquid crystal viewfinder 8.

As shown in FIG. 2, the image recorder 18 produces a still picture file or moving picture file, in which first image data is associated with information about where the data is to be recorded, on the basis of a command from the image recording controller 19. The image recorder 18 then records the still picture file or moving picture file on the basis of a command from the image recording controller 19. The image recorder 18 is, for example, an internal memory, a memory card, or another such recording medium. Information about where the data is to be recorded along with an image signal includes, for example, the date and time when the image was captured, focal distance information, shutter speed information, aperture value information, and imaging mode information.

(3) Imaging Element Unit

Figure 3:
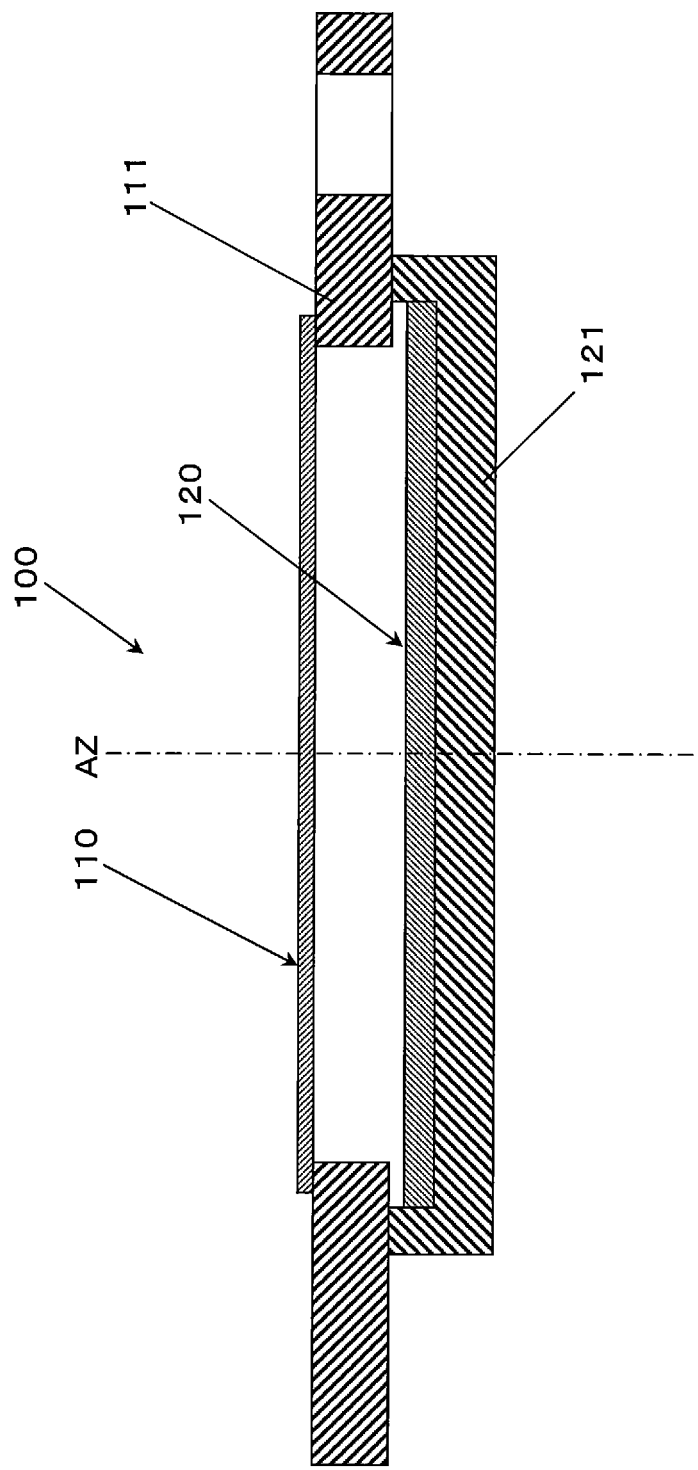
FIG. 3 is a simplified diagram of the configuration of an imaging element unit.

The structure of the imaging element unit 100 will now be described in detail. As shown in FIG. 3, the imaging element unit 100 has the first imaging element 110, the second imaging element 120, a first package 111, and a second package 121.

Figure 5:
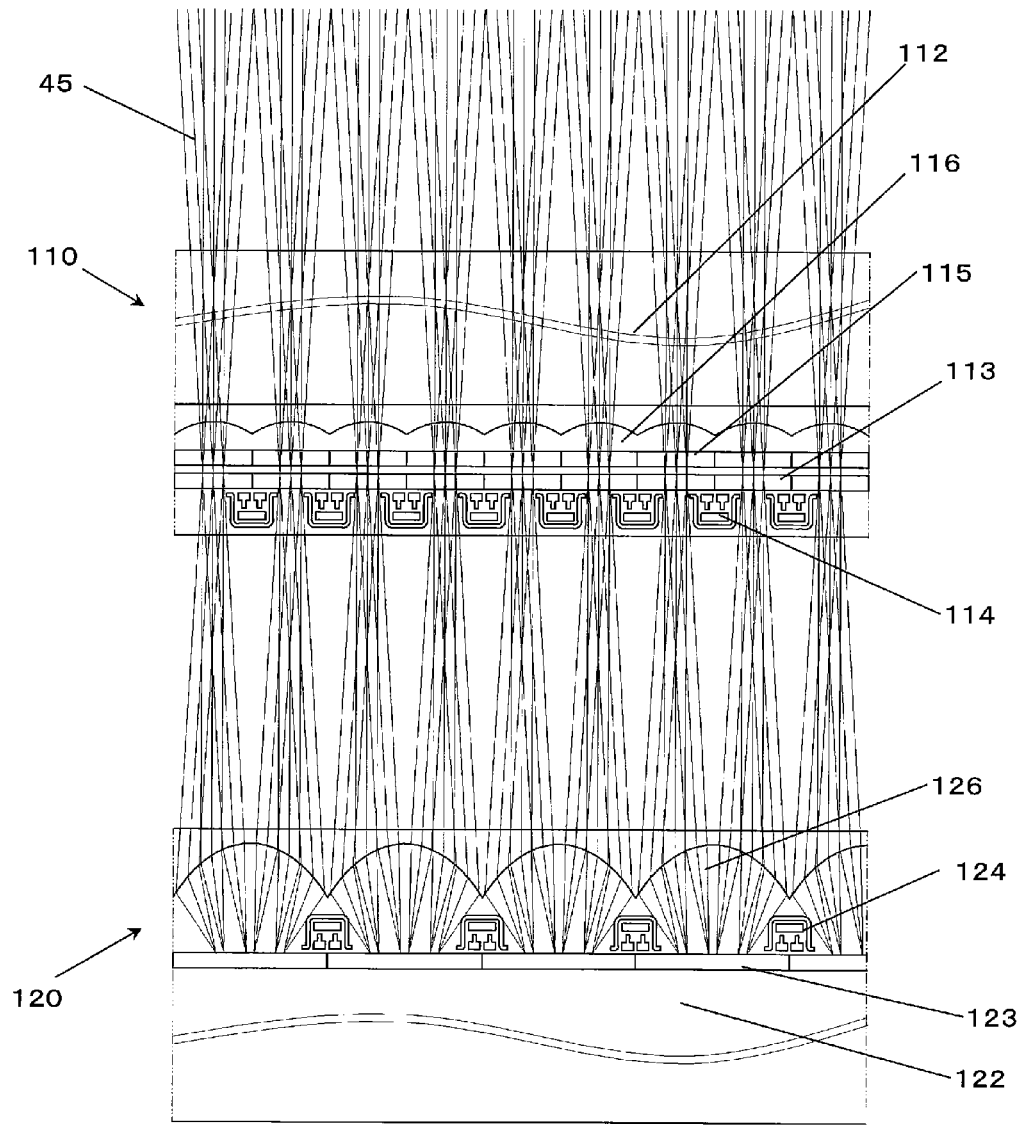
FIG. 5 is a simplified cross section of the first and second imaging elements.

As shown in FIGS. 4A and 5, the first imaging element 110 is a rear face illumination type of imaging element, and is disposed so as to transmit light emitted from the optical system O. More specifically, the first imaging element 110 has the first opto-electrical converter 113, reinforced glass 112, a first circuit portion 114, a first color filter 115, and a first micro-lens 116.

The first opto-electrical converter 113 is made from a semiconductor material, and subjects emitted light to opto-electrical conversion. The first opto-electrical converter 113 has a plurality of first opto-electrical conversion elements 117 disposed in a matrix. The first color filter 115 is provided on the front face side (incident side) of the first opto-electrical converter 113, so only one color of light out of red (R), green (G), and blue (B) is incident on the first opto-electrical conversion elements 117. The first opto-electrical converter 113 has a first imaging face 113a that receives light.

The first circuit portion 114 is a circuit for outputting electrical signals produced by the first opto-electrical conversion elements 117 to a first analog signal processor 13a, and is disposed in the form of a matrix along the boundaries 117a of the plurality of first opto-electrical conversion elements 117. Since the first imaging element 110 is a rear face illumination type, the first circuit portion 114 is disposed on the rear (emission side) of the first opto-electrical converter 113. That is, the first circuit portion 114 is disposed between the first opto-electrical conversion elements 117 and the second imaging element 120.

The first circuit portion 114 has first electrical circuits 114a and first masks 114b. The first electrical circuits 114a include transistors and signal lines, and are disposed at locations corresponding to the boundaries 117a of the first opto-electrical conversion elements 117. The first masks 114b cover the first electrical circuits 114a, and are disposed at locations corresponding to boundaries 127a, just as with the first electrical circuits 114a.

The first color filter 115 is a primary color filter with a Bayer arrangement, and is disposed on the incident side of the first opto-electrical converter 113. The first color filter 115 has a plurality of red filters R, a plurality of green filters and a plurality of blue filters B. The red filters R have higher transmissivity in the red visible light wavelength band than the visible light wavelength bands of colors other than red. The green filters G have higher transmissivity in the green visible light wavelength band than the visible light wavelength bands of colors other than green. The blue filters B have higher transmissivity in the blue visible light wavelength band than the visible light wavelength bands of colors other than blue.

Figure 6A:
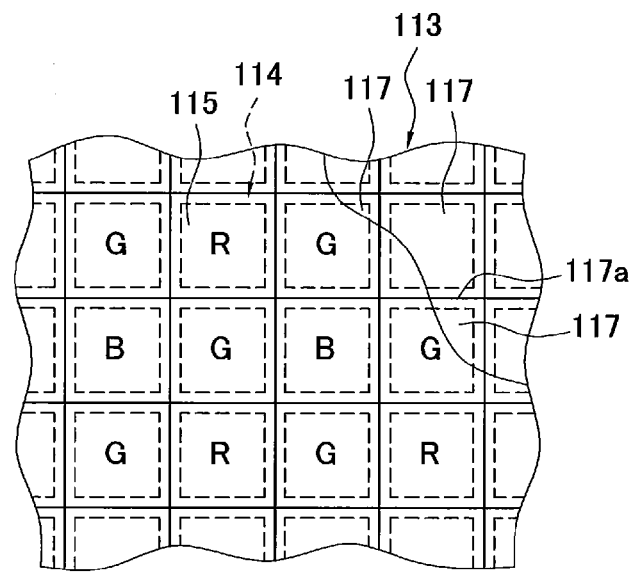
FIG. 6A is a cross section along the VIA-VIA line in FIG. 4.

The red filters R, green filters G, and blue filters B are disposed in a matrix. More specifically, as shown in FIG. 6A, a single set with two rows and two columns consists of a red filter R, two green filters G, and a blue filter B, and these sets are disposed in a matrix. Among the filters in a set, the two green filters G are disposed in diagonally opposite corners. In this embodiment, one filter is disposed at a location corresponding to one first opto-electrical conversion element 117. The first color filter 115 may also be a complementary color filter.

The first micro-lens 116 is a lens for preventing or restricting the mixing of colors, and is disposed on the incident side of the first color filter 115. It could also be said that the first color filter 115 is disposed between the first micro-lens 116 and the first opto-electrical converter 113. The first micro-lens 116 has a plurality of lens components 116a corresponding to the red filters R, the green filters G, and the blue filters B. The lens components 116a collect light so that the light will be correctly incident on the corresponding filters. The first micro-lens 116 allows the first opto-electrical converter 113 to illuminate more efficiently.

The reinforced glass 112 is provided to ensure the strength of the first imaging element 110. More specifically, the reinforced glass 112 is disposed on the incident side of the first micro-lens 116. The reinforced glass 112 is bonded and fixed by a resin 118.

As discussed above, the light incident on the first imaging element 110 is transmitted by the reinforced glass 112, the resin 118, the first micro-lens 116, the first color filter 115, and the second opto-electrical converter 123, in that order, and passes between the first circuit portions 114. Thus, with this first imaging element 110, no mask is provided other than the first masks 114b, so part of the light incident on the first opto-electrical converter 113 is transmitted by the first opto-electrical converter 113 and emitted from the first imaging element 110.

As shown in FIGS. 4B and 5, the second imaging element 120 is a front face illumination type of imaging element, and is disposed so that light emitted from the first imaging element 110 is incident. More specifically, as shown in FIGS. 4B and 5, the second imaging element 120 is disposed on the rear face side of the first imaging element 110, and has the second opto-electrical converter 123, a silicon substrate 122, a second circuit portion 124, and a second micro-lens 126. The second imaging element 120 differs from the first imaging element 110 in that it has no color filter.

Figure 6B:
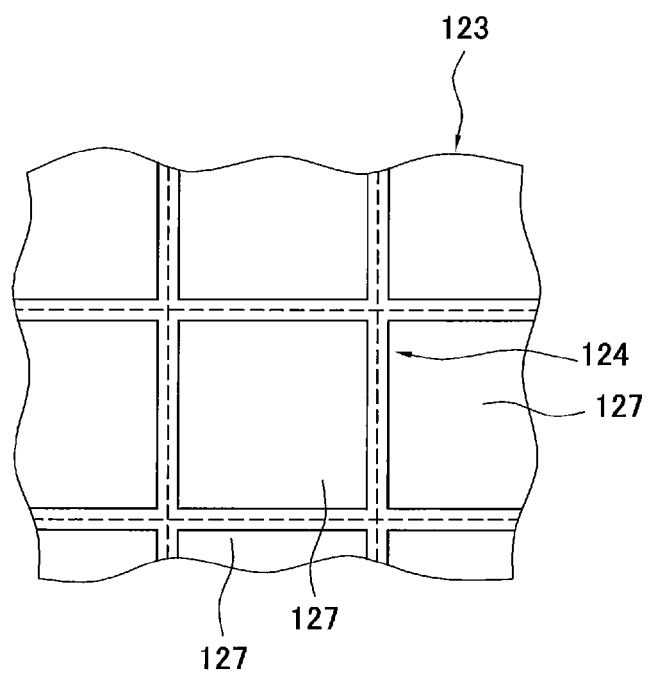
FIG. 6B is a cross section along the VIB-VIB line in FIG. 4.

The second opto-electrical converter 123 is made from a semiconductor material, and subjects incident light to opto-electrical conversion. More specifically, the second opto-electrical converter 123 has a plurality of second opto-electrical elements 127 disposed in a matrix. As shown in FIGS. 4A and 4B, the second pixel pitch R2 of the second imaging element 120 is set greater than the first pixel pitch R1 of the first imaging element 110. As shown in FIGS. 6A and 6B, the second opto-electrical elements 127 are larger than the first opto-electrical conversion elements 117, and the size of one second opto-electrical element 127 is equivalent to the size of four of the first opto-electrical conversion elements 117. Since no color filter is provided on the incident side of the second opto-electrical converter 123, light of three colors (R, G, and B) can be incident on the second opto-electrical elements 127. The second opto-electrical converter 123 has a second imaging face 123a that receives light.

As shown in FIG. 6B, the second circuit portion 124 is a circuit for outputting electrical signals produced by the second opto-electrical elements 127 to a second analog signal processor 13b, and is disposed in the form of a matrix along the boundaries 127a of the plurality of second opto-electrical elements 127. Since the second imaging element 120 is a front face illumination type, the second circuit portion 124 is disposed on the front (incident side) of the second opto-electrical converter 123. That is, the second circuit portion 124 is disposed between the second opto-electrical elements 127 and the first imaging element 110.

The second circuit portion 124 has second electrical circuits 124a and second masks 124b. The second electrical circuits 124a include transistors and signal lines, and are disposed at locations corresponding to the boundaries 127a of the second opto-electrical elements 127. The second masks 124b cover the second electrical circuits 124a, and are disposed at locations corresponding to the boundaries 127a, just as with the second electrical circuits 124a.

The second micro-lens 126 has a plurality of lens components 126a corresponding to the red filters R, green filters G, and blue filters B. The lens components 126a collect light so that the light is properly incident on the corresponding filters. The second micro-lens 126 allows the second opto-electrical converter 123 to illuminate more efficiently.

The silicon substrate 122 is provided to ensure the strength of the second imaging element 120, and is disposed on the incident side of the second micro-lens 126. The second micro-lens 126 is fixed to the silicon substrate 122.

As discussed above, the light incident on the second imaging element 120 goes between the second circuit portions 124 and is transmitted by the second micro-lens 126, a color filter 125, and the second opto-electrical converter 123, in that order.

The first package 111 is disposed between the first imaging element 110 and the second imaging element 120. The first imaging element 110 is fixed to the first package 111. The first imaging element 110 is disposed on the front face side of the first package 111. The first package 111 has an opening 111b and three screw holes 111a. The opening 111b is disposed near the center of the first package 111. The light emitted from the first imaging element 110 goes through the opening 111b and is incident on the second imaging element 120. The first package 111 is fixed with screws (not shown) using the screw holes 111a. The first package 111 may instead be fixed adhesively.

The second package 121 is a member used to support the second imaging element 120, and is fixed to the first package 111. The second package 121 is disposed on the rear face side of the first package 111, and the second imaging element 120 is fixed to the second package 121. A specific gap is maintained between the first imaging element 110 and the second imaging element 120.

(4) First Image Processor and Second Image Processor

Since the imaging element unit 100 has the first imaging element 110 and the second imaging element 120, as mentioned above the digital camera 1 has two image processors (the first image processor 11a and the second image processor 11b). The first image processor 11a and second image processor 11b will now be described in detail.

As shown in FIG. 2, an image signal outputted from the first imaging element 110 is sent from the first analog signal processor 13a to processing by a first A/D converter 14a, a first digital signal processor 15a, the first buffer memory 16a, and a image compressor 17, in that order.

The first analog signal processor 13a subjects the image signal outputted from the first imaging element 110 to gamma processing or other such analog signal processing. The first A/D converter 14a converts the analog signal outputted from the first analog signal processor 13a into a digital signal. The first digital signal processor 15a subjects the image signal converted into a digital signal by the first A/D converter 14a to noise removal, contour enhancement, and other such digital signal processing. The first buffer memory 16a is a RAM, and temporarily stores image signals. The image signals stored in the first buffer memory 16a are sent from the image compressor 17 to processing by the image recorder 18. The image signals stored in the first buffer memory 16a are read out at a command from the image recording controller 19 and are sent to the image compressor 17. The image signal data sent to the image compressor 17 is compressed according to a command from the image recording controller 19. The image signal is compressed to a data size that is smaller than that of the original data. Methods for compressing the image signal include, for example, the JPEG (Joint Photographic Experts Group) method, in which compression is performed for each frame of an image signal. After this, the compressed image signal is recorded by the image recording controller 19 to the image recorder 18. If recording with raw data is selected by the user, it is also possible to record raw data to the image recorder 18, bypassing the image compressor 17.

Meanwhile, image signals outputted from the second imaging element 120 are sent from the second analog signal processor 13b to processing by a second A/D converter 14b, a second digital signal processor 15b, and the second buffer memory 16b.

The second analog signal processor 13b subjects the image signal outputted from the second imaging element 120 to gamma processing or other such analog signal processing. The second A/D converter 14b converts the analog signal outputted from the second analog signal processor 13b into a digital signal. The second digital signal processor 15b subjects the image signal converted into a digital signal by the second A/D converter 14b to noise removal, contour enhancement, and other such digital signal processing. The second buffer memory 16b is a RAM, and temporarily stores image signals. The image signals stored in the second buffer memory 16b can be read out as needed by the body controller 10.

Defocus Determination (1) Reference Example

Before we describe defocus determination using two imaging elements (focal point detection method), we will briefly describe contrast AF using one imaging element.

With contrast AF, the focal position is decided on the basis of an AF evaluation value. The AF evaluation value is a numerical value obtained by integrating the high-frequency components out of the spatial frequency component of the image data. The greater is the AF evaluation value, the better is the focus (the higher the sharpness of the image).

However, the AF evaluation value itself does not indicate the focal position, and is merely a relative index used for deciding the focal position.

Thus, contrast AF involves moving the focus lens and detecting the position of the focus lens at which the AF evaluation value is greatest. A so-called hill climbing method is used to detect the position of the focus lens at which the AF evaluation value is greatest. With this method, image data are acquired at a specific period (for example, a frame rate) with moving the focus lens, and the AF evaluation value is calculated form the acquired image data. To confirm the peak position of the AF evaluation value, the focus lens is beyond the position at which the AF evaluation value is greatest, and when a drop in the AF evaluation value has been confirmed, the position of the focus lens at which the AF evaluation value is greatest is specified.

However, depending on the imaging conditions, there may be little change in the AF evaluation value, so to decide on the greatest AF evaluation value it is necessary to continue monitoring the AF evaluation value for three or four frames after the AF evaluation value reaches its maximum. Also, the direction in which the focus lens is initially moved is decided on the basis of various conditions, but it is conceivable that the initially decided direction will not match the direction of focus. If the focus lens is driven in the wrong direction, the AF evaluation value must be monitored for about three or four frames to determine whether or not the direction in which the focus lens is driven is correct. As discussed above, with the contrast AF in the reference example, it takes time to detect the peak of the AF evaluation value.

(2) This Embodiment

In view of the above, with this digital camera 1, the time it takes for defocus determination is shortened by using two imaging elements (the first imaging element 110 and the second imaging element 120). The defocus determination processing will now be described.

FIGS. 7A to 7D show the light flux 45 formed by the first imaging face 113a of the first imaging element 110, the second imaging face 123a of the second imaging element 120, and the optical system O. The circle at the bottom of each drawing shows the blurred image circle at the first imaging face 113a and the second imaging face 123a. The larger is the blurred image circle, the more blurred is the image, and the smaller is the AF evaluation value calculated in contrast AF (also called the contrast value).

Here, an image recorded to the image recorder 18 shall be an image produced not by the second imaging element 120, but by the first imaging element 110. Therefore, a focal state in which the subject is in focus refers to a state in which the focused position FP of the light flux 45 is disposed on the first imaging face 113a. Also, a so-called pre-focal state refers to a state in which the focused position FP is disposed more toward the front (the incident side) than the first imaging face 113a, and a so-called post-focal state refers to a state in which the focused position FP is disposed more toward the rear (the emission side) than the first imaging face 113a.

Here, image data based on an electrical signal produced by the first imaging element 110 shall be termed first image data, and image data based on an electrical signal produced by the second imaging element 120 shall be termed second image data. Further, an AF evaluation value calculated from first image data shall be termed a first evaluation value EV1, and an AF evaluation value calculated from second image data shall be termed a second evaluation value EV2.

FIGS. 7A and 7D show a post-focal state. As shown in FIG. 7A, a state in which the focused position FP of the light flux 45 is in between the first imaging face 113a and the second imaging face 123a shall hereinafter be referred to as a first post-focal state. As shown in FIG. 7D, a state in which the focused position FP is disposed more to the rear than the second imaging face 123a shall hereinafter be referred to as a second post-focal state. FIG. 7B shows a focused state, and FIG. 7C shows a pre-focal state.

As shown in FIGS. 7A to 7D, how the blurred image circle for images based on first image data and second image data changes when the focus lens L is moved will vary with the positional relation between the focused position FP, the first imaging face 113a, and the second imaging face 123a. As discussed above, as the blurred image circle becomes smaller, the AF evaluation value increases, and as the blurred image circle becomes larger, the AF evaluation value decreases. Therefore, the positional relation between the focused position FP, the first imaging face 113a, and the second imaging face 123a can be ascertained by monitoring how the first evaluation value EV1 and the second evaluation value EV2 change.

Figure 10A:
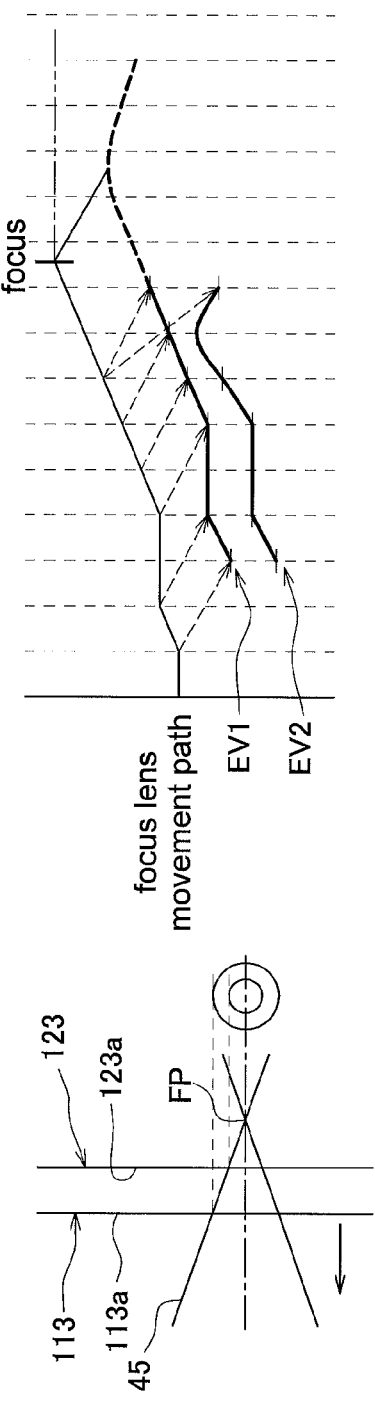
FIG. 10A is a focal point detection time chart in a second rear focus state when the drive direction of the focus lens is not inverted.

More specifically, as shown in FIGS. 8A and 10A, when the first evaluation value EV1 and the second evaluation value EV2 both increase in a state in which the focus lens L is being driven in one direction, it can be seen that the focused position FP is in the pre-focal state or the second post-focal state, and it can also be seen that the focused position FP is approaching the first imaging face 113a and the second imaging face 123a. Therefore, when the first evaluation value EV1 and the second evaluation value EV2 both increase, it can be concluded that the focus lens L is being driven in the correct direction in the pre-focal state or the second post-focal state.

Also, as shown in FIG. 8A, when drive of the focus lens L is continued and the first evaluation value EV1 reaches its maximum (peaks) before the second evaluation value EV2 does, it can be concluded that the focused position FP has changed from the pre-focal state to the first post-focal state. More precisely, when the first evaluation value EV1 and the second evaluation value EV2 both increase and then just the first evaluation value EV1 begins to decrease, it can be concluded that the focused position FP has changed from the pre-focal state to the first post-focal state.

Meanwhile, as shown in FIG. 10A, when drive of the focus lens L is continued and the second evaluation value EV2 reaches its maximum before the first evaluation value EV1 does, it can be concluded that the focused position FP has changed from the second post-focal state to the first post-focal state. More precisely, when the first evaluation value EV1 and the second evaluation value EV2 both increase and then just the second evaluation value EV2 begins to decrease, it can be concluded that the focused position FP has changed from the second post-focal state to the first post-focal state.

Figure 10B:
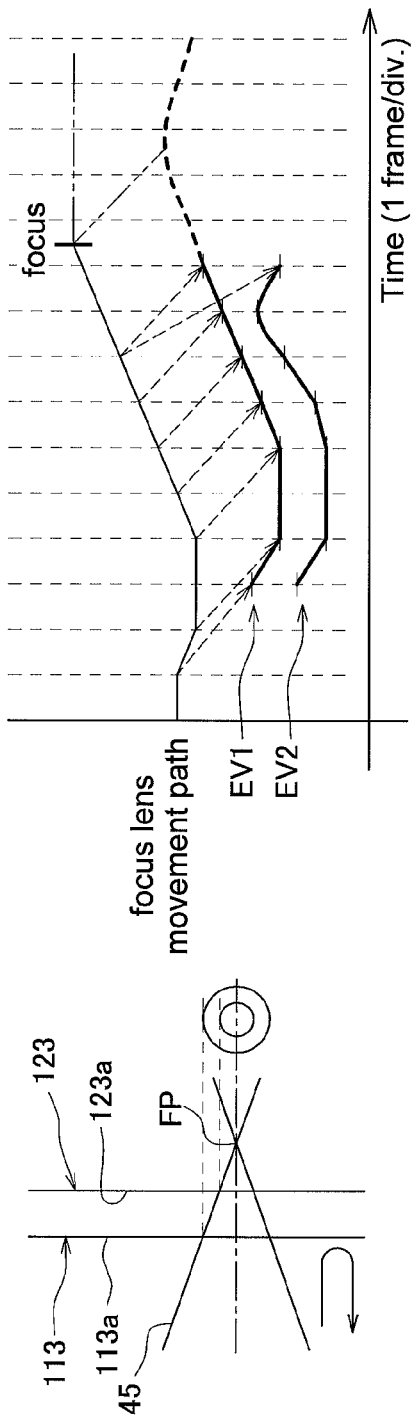
FIG. 10B is a focal point detection time chart in a second rear focus state when the drive direction of the focus lens is inverted.

As shown in FIGS. 8B and 10B, when the first evaluation value EV1 and the second evaluation value EV2 both decrease in a state in which the focus lens L is being driven in one direction, it can be seen that the focused position FP is in the pre-focal state or the second post-focal state, and it can also be seen that the focused position FP is moving away from the first imaging face 113a and the second imaging face 123a. Therefore, it can be concluded that the focus lens L is being driven in the wrong direction in the pre-focal state or the second post-focal state on the basis of the first evaluation value EV1 and the second evaluation value EV2.

Also, as shown in FIG. 8B, if the focus lens L is driven in reverse after the first evaluation value EV1 and the second evaluation value EV2 have decreased, the first evaluation value EV1 and the second evaluation value EV2 will both increase. After this, if the first evaluation value EV1 reaches its maximum before the second evaluation value EV2 does, then it can be concluded that the focused position FP has changed from the pre-focal state to the first post-focal state, just as in the case shown in FIG. 8A.

Meanwhile, as shown in FIG. 10B, if the focus lens L is driven in reverse after the first evaluation value EV1 and the second evaluation value EV2 have decreased, the first evaluation value EV1 and the second evaluation value EV2 will both increase. After this, if the first evaluation value EV1 reaches its maximum before the second evaluation value EV2 does, then it can be concluded that the focused position FP has changed from the pre-focal state to the first post-focal state, just as in the case shown in FIG. 10A.

Furthermore, as shown in FIG. 9A, when the first evaluation value EV1 increases and the second evaluation value EV2 decreases in a state in which the focus lens L is being driven in one direction, it can be seen that the focused position FP is in the first post-focal state, and it can also be seen that the focused position FP is approaching the first imaging face 113a and moving away from the second imaging face 123a. Therefore, it can be concluded that the focus lens L is being driven in the correct direction in the first post-focal state on the basis of the first evaluation value EV1 and the second evaluation value EV2.

Meanwhile, as shown in FIG. 9B, when the first evaluation value EV1 decreases and the second evaluation value EV2 increases in a state in which the focus lens L is being driven in one direction, it can be seen that the focused position FP is in the first post-focal state, and it can also be seen that the focused position FP is moving away from the first imaging face 113a and approaching the second imaging face 123a. Therefore, it can be concluded that the focus lens L is being driven in the correct direction in the first post-focal state on the basis of the first evaluation value EV1 and the second evaluation value EV2.

As described above, the positional relation of the focused position FP, the first imaging face 113a, and the second imaging face 123a can be determined on the basis of the first evaluation value EV1 and the second evaluation value EV2.

Autofocus

Autofocus by the defocus determination method discussed above will now be described. Here, autofocus will be described using as an example single AF in the capture of a still picture.

Figure 11:
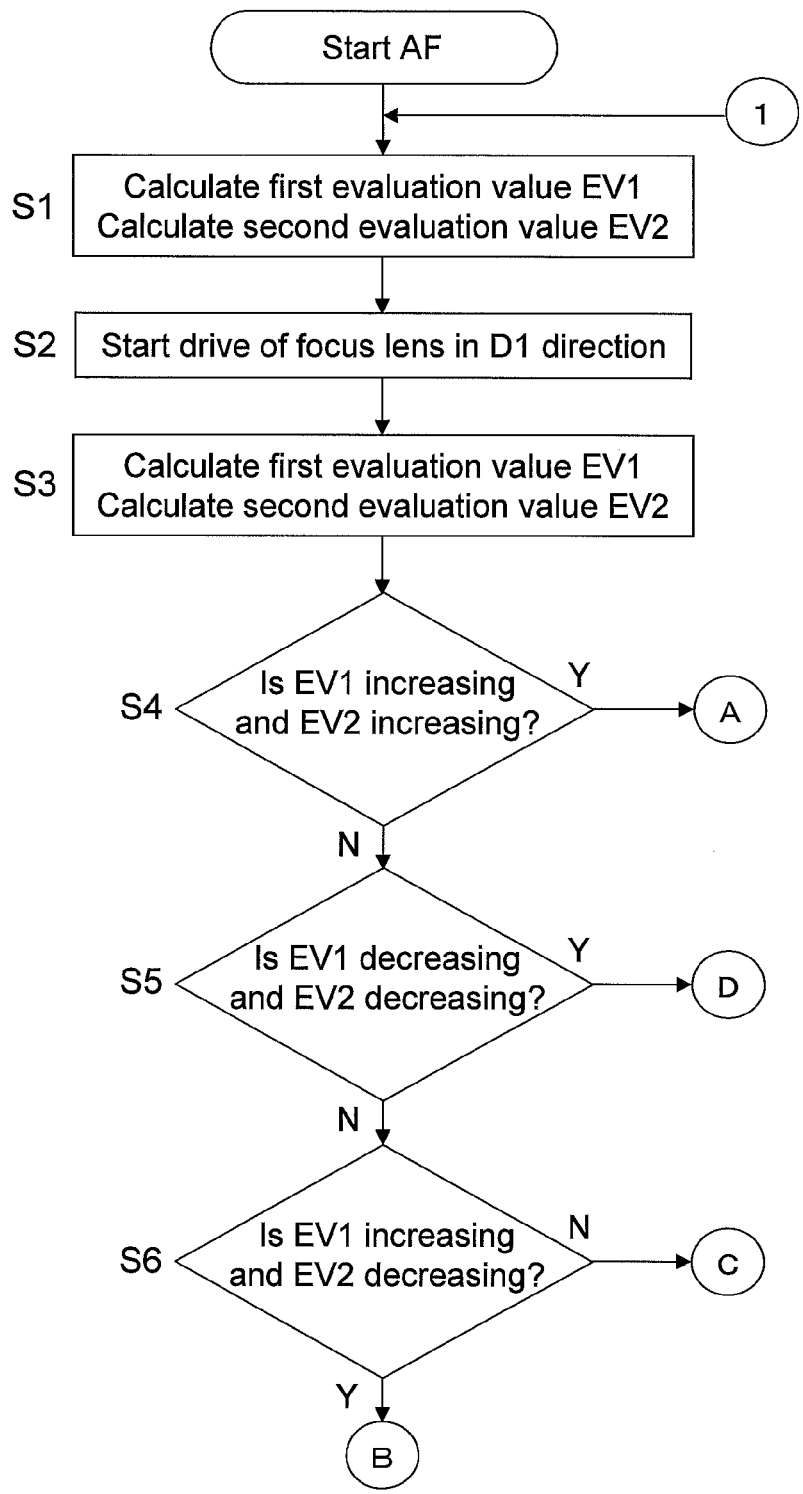
FIG. 11 is an AF flowchart.

In still picture imaging mode, a real-time image of the subject is displayed on the liquid crystal monitor 20 or the liquid crystal viewfinder 8. First image data is produced at a specific frame rate (such as 30 fps) by the first imaging element 110 of the imaging element unit 100. In this state, when the release button 30 is pressed half-way down, for example, imaging preparation is commenced. More specifically, as shown in FIG. 11, in a state in which the focus lens has been halted, the first evaluation value EV1 is calculated by the first evaluation value calculator 51a on the basis of the first image data, and the second evaluation value EV2 is calculated by the second evaluation value calculator 51b on the basis of the second image data produced by the second imaging element 120 (S1). As shown in FIGS. 8A to 10B, in this embodiment the time it takes to calculate the first evaluation value EV1 and the second evaluation value EV2 is equivalent to approximately two frames. Since the amount of light incident on the first imaging element 110 is greater than the amount of light incident on the second imaging element 120, the first evaluation value EV1 is always greater than the second evaluation value EV2.

The first evaluation value EV1 and second evaluation value EV2 thus calculated are temporarily stored at a specific address in the RAM 10a of the body controller 10. At this point, position information about the focus lens L detected by the position detection sensor 67 at the same timing as the acquisition timing of the first image data is stored at a specific address in the RAM 10a, having been associated with the first evaluation value EV1. Also, position information about the focus lens L detected by the position detection sensor 67 at the same timing as the acquisition timing of the second image data is stored at a specific address in the RAM 10a, having been associated with the second evaluation value EV2.

In this embodiment, the position of the focus lens L is detected at a specific period by the position detection sensor 67, and the detection result is sent through the lens controller 40 to the body controller 10. The detection period of the position detection sensor 67 is much shorter than the frame rate of the first imaging element 110 and the second imaging element 120, so position information detected at substantially the same timing as the acquisition timing of the first image data and second image data (that is, the timing at which timing signals produced by the first timing generator 12a and the second timing generator 12b are inputted to the body controller 10) can be selected by the body controller 10.

Next, the focus lens L is driven (S2). The drive direction is decided by the body controller 10 on the basis of various kinds of information, such as the current position of the focus lens L and the focal distance of the optical system O. In this embodiment, the drive direction in step S2 shall be termed the D1 direction. The drive amount shall be the smallest drive amount of the focus motor 64, or the drive amount for one frame, for example. After the focus lens L is driven in the D1 direction, the first evaluation value EV1 and the second evaluation value EV2 are calculated by the first evaluation value calculator 51a and the second evaluation value calculator 51b, respectively, on the basis of the first image data and second image data (S3). The first image data and second image data here are acquired at different timing from that of the first image data and second image data used in step S1. In FIGS. 8A to 10B, this is the first image data and second image data for the next frame after the first image data and second image data used in step S1.

The first evaluation value EV1 and second evaluation value EV2 calculated in step S3 are temporarily stored at a specific address in the RAM 10a of the body controller 10. Here, position information about the focus lens L detected by the position detection sensor 67 at the same timing as the acquisition timing of the first image data is stored at a specific address in the RAM 10a, having been associated with the first evaluation value EV1. Also, position information about the focus lens L detected by the position detection sensor 67 at the same timing as the acquisition timing of the second image data is stored at a specific address in the RAM 10a, having been associated with the second evaluation value EV2.

Next, the first evaluation value determination section 52a determines whether the first evaluation value EV1 has increased or decreased, the second evaluation value determination section 52b determines whether the second evaluation value EV2 has increased or decreased, and the drive direction of the focus lens L is decided by the state determination section 53 on the basis of a first determination result and a second determination result (S4 to S6). More specifically, the two first evaluation values EV1 stored in the RAM 10a of the body controller 10 are compared by the first evaluation value determination section 52a, and the first evaluation value determination section 52a produces a first determination result indicating the increase or decrease in the first evaluation value EV1. The first determination result is stored in the RAM 10a. Also, the two second evaluation values EV2 stored in the RAM 10a of the body controller 10 are compared by the second evaluation value determination section 52b, and the second evaluation value determination section 52b produces a second determination result indicating the increase or decrease in the second evaluation value EV2. The second determination result is stored in the RAM 10a.

If the first evaluation value EV1 and the second evaluation value EV2 are both increasing, the drive direction of the focus lens L is correct, so drive of the focus lens L in the D1 direction is begun (S4 and S8A). On the other hand, if the first evaluation value EV1 and the second evaluation value EV2 are both decreasing, the drive direction of the focus lens L is wrong, so drive of the focus lens L in a D2 direction is begun (S5 and S8B).

If the first evaluation value EV1 is increasing and the second evaluation value EV2 is decreasing, the drive direction of the focus lens L is correct, so drive of the focus lens L in the D1 direction is begun (S6 and S20A). On the other hand, if the first evaluation value EV1 is decreasing and the second evaluation value EV2 is increasing, the drive direction of the focus lens L is wrong, so drive of the focus lens L in a D2 direction is begun (S6 and S20B).

Figure 12:
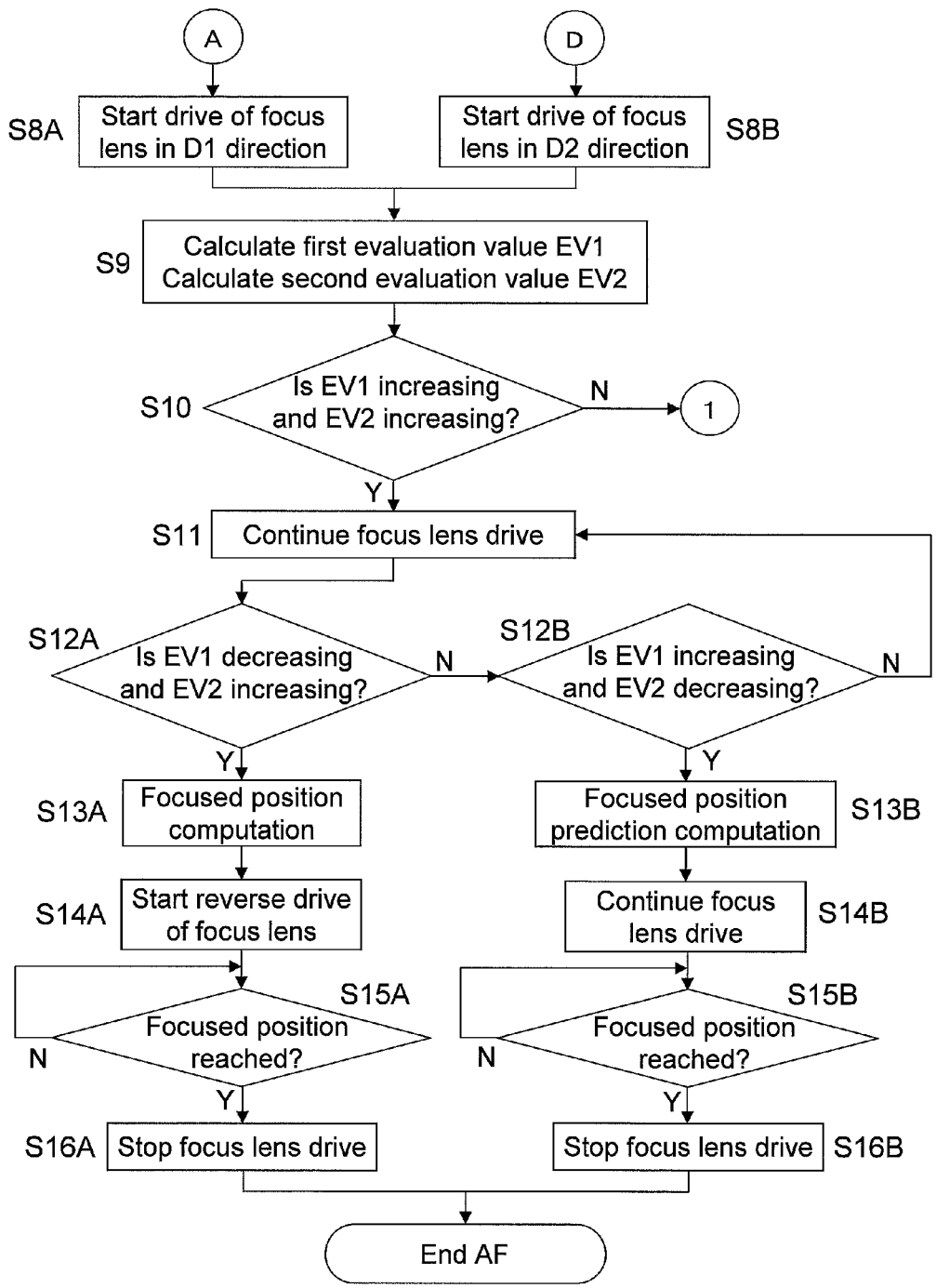
FIG. 12 is an AF flowchart.

The flow will be described through reference to FIG. 12. After steps S8A and S8B, the first evaluation value EV1 is calculated by the first evaluation value calculator 51a, and the second evaluation value EV2 is calculated by the second evaluation value calculator 51b (S9). After the calculation of the first evaluation value EV1 and second evaluation value EV2, the first evaluation value determination section 52a determines whether the first evaluation value EV1 has increased or decreased, and the second evaluation value determination section 52b determines whether the second evaluation value EV2 has increased or decreased. Then, the state determination section 53 determines whether or not the first evaluation value EV1 and the second evaluation value EV2 are both increasing on the basis of the first determination result and second determination result (S10). If either the first evaluation value EV1 or the second evaluation value EV2 is decreasing, the processing returns to step S1, and determination of the drive direction is carried out again. On the other hand, if the first evaluation value EV1 and the second evaluation value EV2 are both increasing, drive of the focus lens L is continued (S11).

In a state in which drive of the focus lens L is continuing, determination of the increase or decrease in the first evaluation value EV1 and second evaluation value EV2 is repeated by the first evaluation value determination section 52a, the second evaluation value determination section 52b, and the state determination section 53 (S12A and S12B). If the first evaluation value EV1 is decreasing and the second evaluation value EV2 is increasing, the first evaluation value EV1 has peaked, so the focus computer 54 calculates the position of the focus lens L corresponding to the focused state on the basis of the first evaluation value EV1 (S12A and S13A). More specifically, the focus computer 54 determines the peak of the first evaluation value EV1 on the basis of the first determination result, and selects the first evaluation value EV1 corresponding to the peak on the basis of the plurality of first evaluation values EV1 stored in the RAM 10a. The selected first evaluation value EV1 is stored at a specific address in the RAM 10a of the body controller 10 as a first maximum evaluation value.

The focus computer 54 also founds a series of change curves for the first evaluation value EV1 by computation, and calculates position information about the focus lens L corresponding to the maximum value on this curve (the apex). The position information calculated by the focus computer 54 is stored as a target position at a specific address in the RAM 10a of the body controller 10. This target position is sent from the body controller 10 to the lens controller 40, and is stored in the RAM 40a of the lens controller 40.

After focal position computation, reverse drive of the focus lens L is begun (S14A), and the focus lens L is driven by the focus motor 64 to the target position. More specifically, the current position of the focus lens L detected at a specific period by the position detection sensor 67 is successively compared by the focus drive controller 41 with the target position stored in the RAM 40a of the lens controller 40 (S15A). If the focus drive controller 41 determines that the target position matches the detected current position, then the drive of the focus lens L is stopped by the focus drive controller 41 (S16A). As a result, the focus lens L stops at the position where the first evaluation value EV1 is greatest, and an in-focus image can be acquired by the first imaging element 110.

Meanwhile, if it is concluded in step S12A that the condition is not met, then the state determination section 53 checks for an increase or decrease in the first evaluation value EV1 and second evaluation value EV2 on the basis of the first determination result and second determination result in order to determine whether or not the second evaluation value EV2 has peaked (S12B). If the first evaluation value EV1 is increasing and the second evaluation value EV2 is decreasing, the focus prediction section 55 predicts the position of the focus lens L corresponding to a focused state (S13B). The focal position prediction computation will now be described.

If the first evaluation value EV1 is increasing the second evaluation value EV2 is decreasing, the second evaluation value EV2 peaks before the first evaluation value EV1, so as shown in FIGS. 10A to 10B, if the drive of the focus lens L is continued beyond this, the focused position FP will reach the first imaging face 113a of the first imaging element 110. That is, if it is known how far the focus lens L must be moved in order to move the focused position FP from the second imaging face 123a to the first imaging face 113a, then the focused position FP can be moved over the first imaging face 113a by driving the focus lens L by this movement amount from the position corresponding to the peak of the second evaluation value EV2.

Utilizing this, if the first evaluation value EV1 is increasing and the second evaluation value EV2 is decreasing in step S12B, the position of the focus lens L corresponding to the focused position is calculated by the focus prediction section 55 on the basis of the second evaluation value EV2 (S13B). More specifically, the focus prediction section 55 finds by computation a change curve for a series of second evaluation values EV2, and calculates the second evaluation value EV2 corresponding to the maximum value thereof (the apex). The calculated second evaluation value EV2 is stored as a second maximum evaluation value at a specific address in the RAM 10a of the body controller 10.

Further, the focus prediction section 55 selects position information about the focus lens L associated with the second maximum evaluation value. The position information selected by the focus prediction section 55 is stored as a reference position at a specific address in the RAM 10a of the body controller 10. The position of the focus lens L corresponding to the focused position is calculated as the target position by the focus prediction section 55 on the basis of the selected reference position, a K value pre-stored in a ROM 10b of the body controller 10, and focal distance information sent from the lens controller 40.

Here, the K value indicates the proportion of the amount of displacement of back-focus with respect to the amount of movement of the focus lens L. Therefore, the K value can be used to calculate the distance needed to move the focused position FP from the second imaging face 123a to the first imaging face 113a. When the K value varies with the focal distance of the optical system O, the K values corresponding to various focal distances are stored ahead of time in the lens controller 40.

Thus, the focus prediction section 55 calculates the focal distance of the focus lens L needed to move the focused position FP over the first imaging face 113a, and calculates the target position of the focus lens L.

After focused position prediction computation, drive of the focus lens L is continued (S14B), and the focus lens L is driven by the focus motor 64 to the target position. More specifically, the current position of the focus lens L detected at a specific period by the position detection sensor 67 is successively compared to the target position stored in the RAM 40a of the lens controller 40 by the focus drive controller 41 (S15B). If the focus drive controller 41 determines that the detected current position matches the target position, the drive of the focus lens L is stopped by the focus drive controller 41 (S16B). As a result, the focus lens L stops at the position where the first evaluation value EV1 is greatest, and an in-focus image can be acquired by the first imaging element 110.

Figure 13:
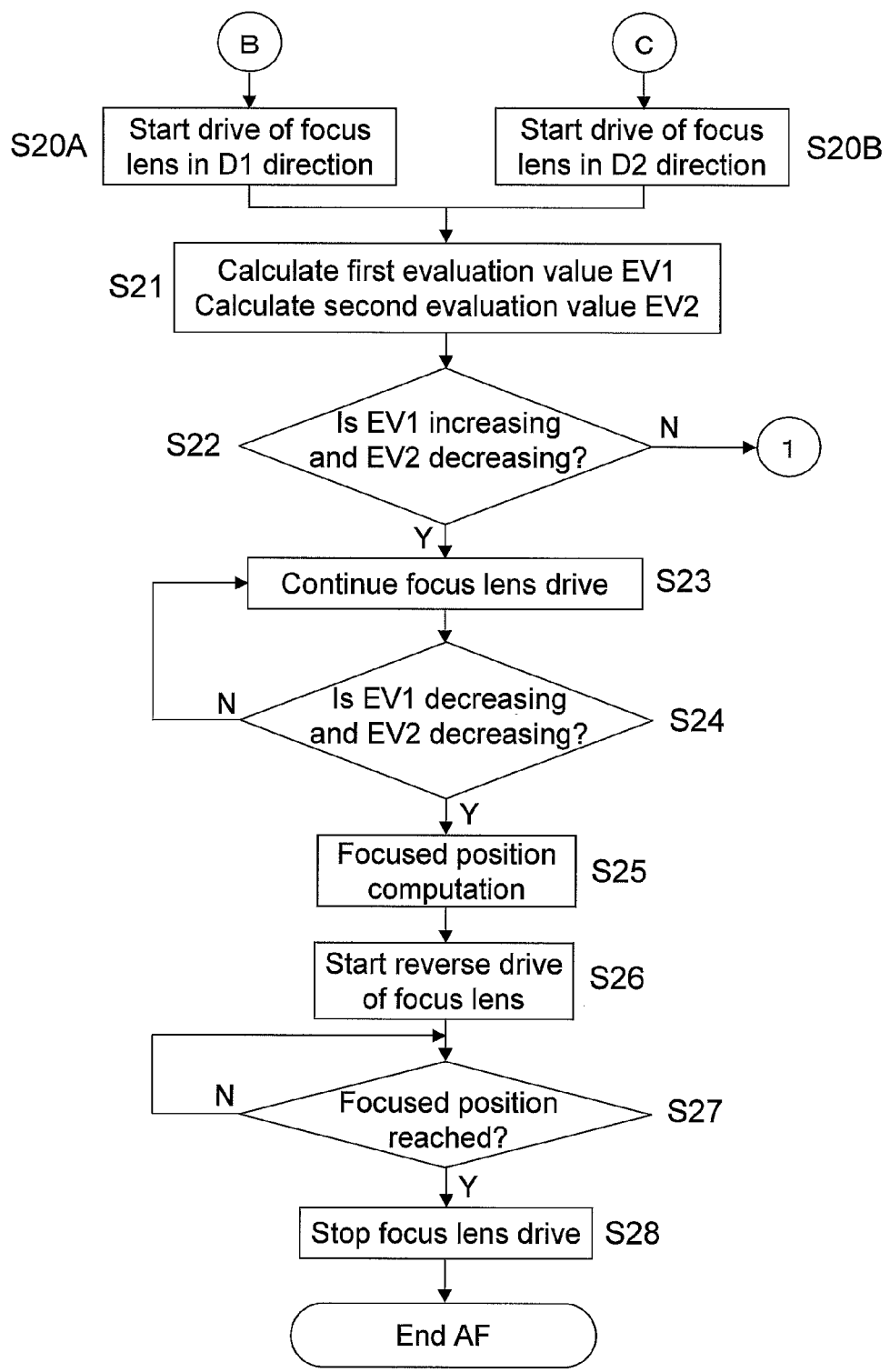
FIG. 13 is an AF flowchart.

The flow shown in FIG. 13 will now be described. After steps S20A and S20B, the first evaluation value EV1 is calculated by the first evaluation value calculator 51a, and the second evaluation value EV2 is calculated by the second evaluation value calculator 51b (S21). After calculation of the first evaluation value EV1 and second evaluation value EV2, the first evaluation value determination section 52a determines whether the first evaluation value EV1 has increased or decreased, and the second evaluation value determination section 52b determines whether the second evaluation value EV2 has increased or decreased. Further, the state determination section 53 determines whether or not the first evaluation value EV1 has increased and the second evaluation value EV2 has decreased on the basis of the first determination result and the second determination result (S22). If the first evaluation value EV1 has increased and the second evaluation value EV2 has decreased, the drive of the focus lens L is continued (S23), but if this condition is not met, the processing returns to step S1.

After step S23, the state determination section 53 determines whether or not the first evaluation value EV1 and second evaluation value EV2 are both decreasing, in a state in which the drive of the focus lens L is being continued (S24). If the evaluation value EV1 and second evaluation value EV2 are both decreasing, then the focus computer 54 performs focused position computation just as in step S13A (S25).

Also, the focus lens L is driven to the target position just as in steps S14A to S16A (S26 to S28). As a result, the focus lens L stops at the position where the first evaluation value EV1 is greatest, and an in-focus image can be acquired by the first imaging element 110. On the other hand, if the above-mentioned condition is not met in step S24, the drive of the focus lens L is continued, and steps S23 and S24 are repeated (S23 and S24).

Thus, with this digital camera 1, an AF evaluation value is acquired by two imaging elements (the first imaging element 110 and the second imaging element 120), and contrast AF is performed on the basis of these two AF evaluation values, so the time it takes to detect the focal point can be greatly reduced.

Continuous AF

Figure 14:
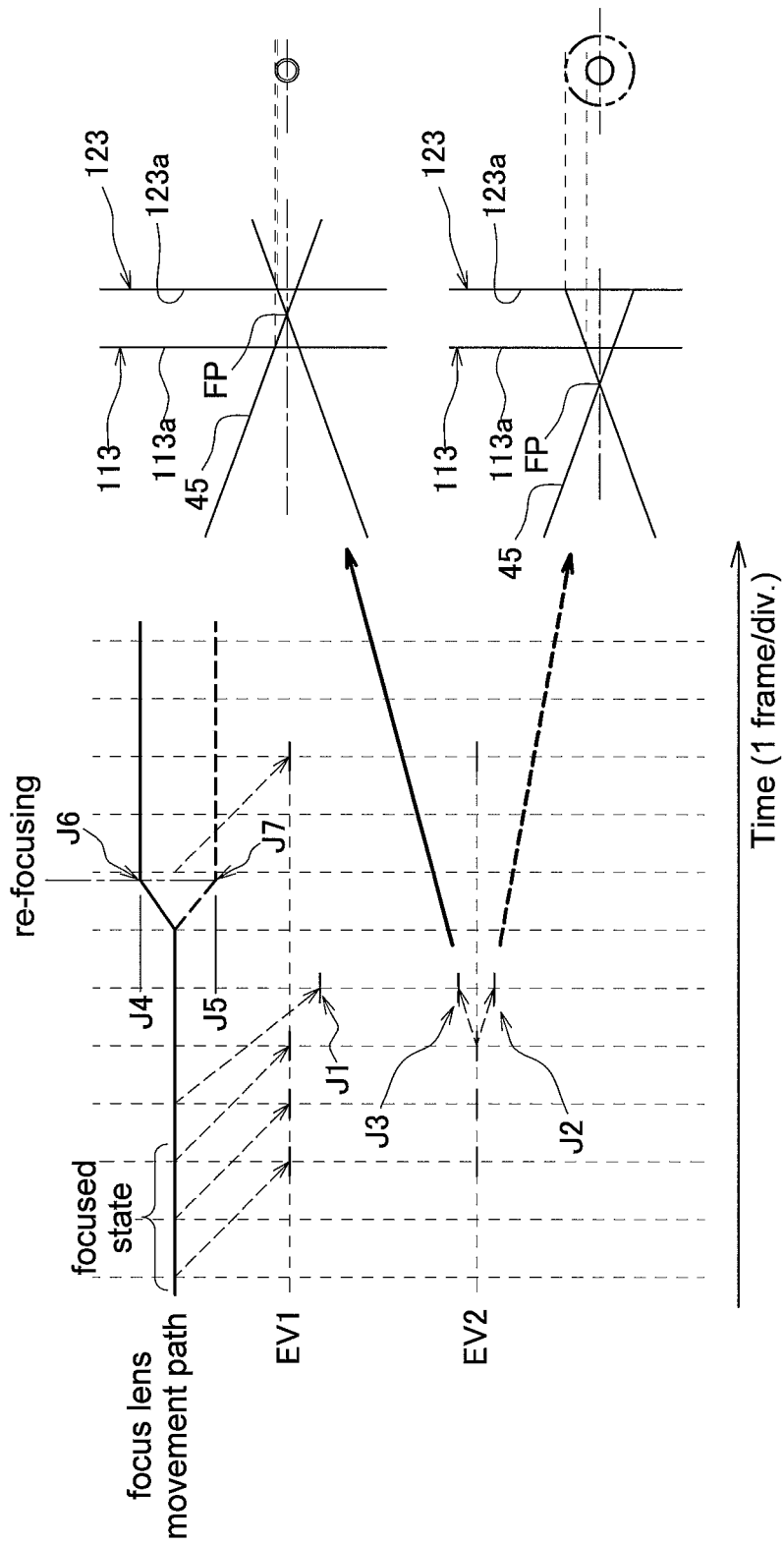
FIG. 14 is a time chart for continuous AF.

Furthermore, as shown by the time chart in FIG. 14, the time it takes for re-focusing can also be shortened when continuous AF is used. With continuous AF, autofocusing is continuously performed to maintain the focused state. For instance, continuous AF is executed during moving picture imaging, or after a focused state is attained in single AF (after steps S16A, S16B, and S28).

Figure 15:
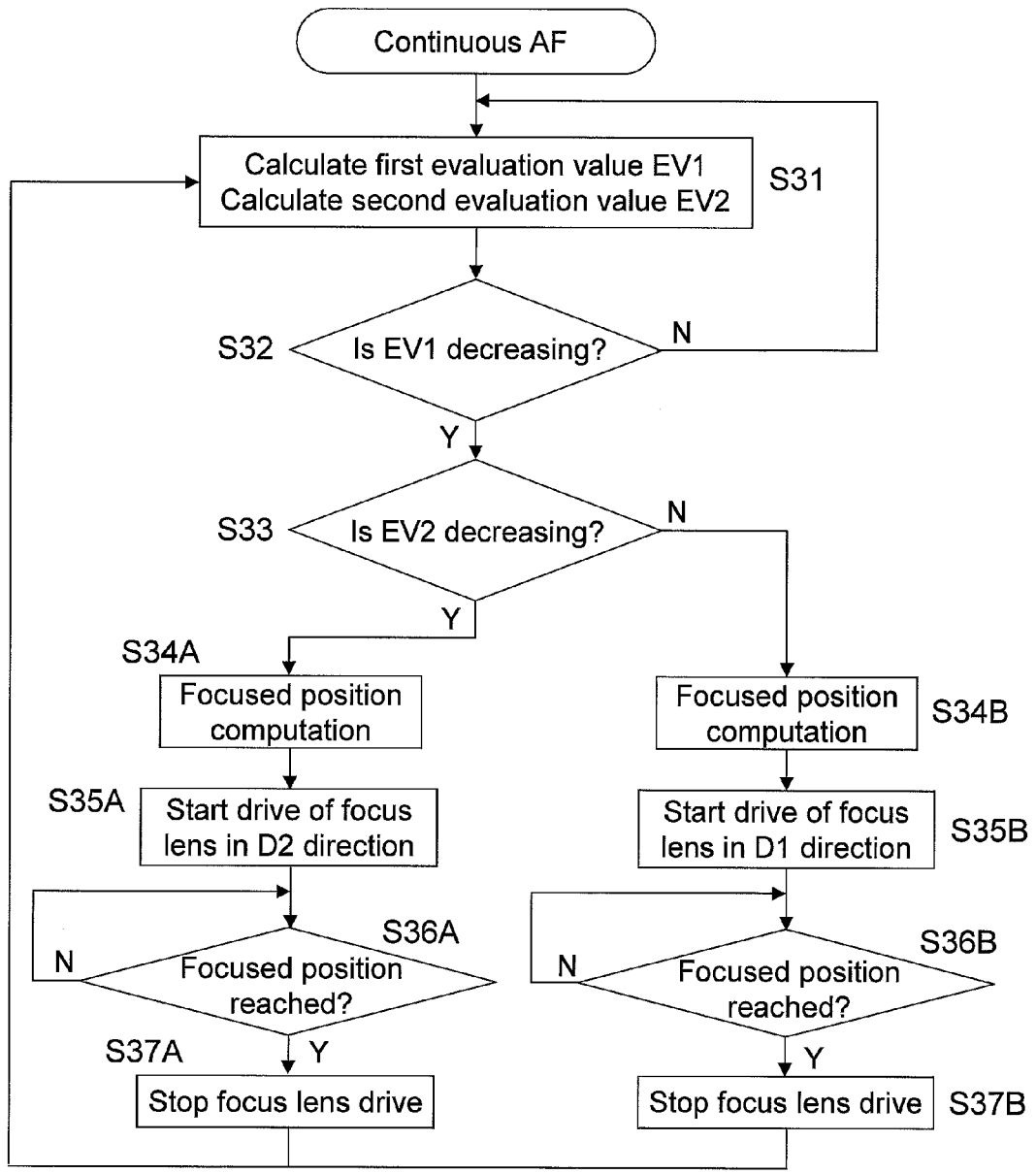
FIG. 15 is a flowchart for continuous AF.
Figure 17A:
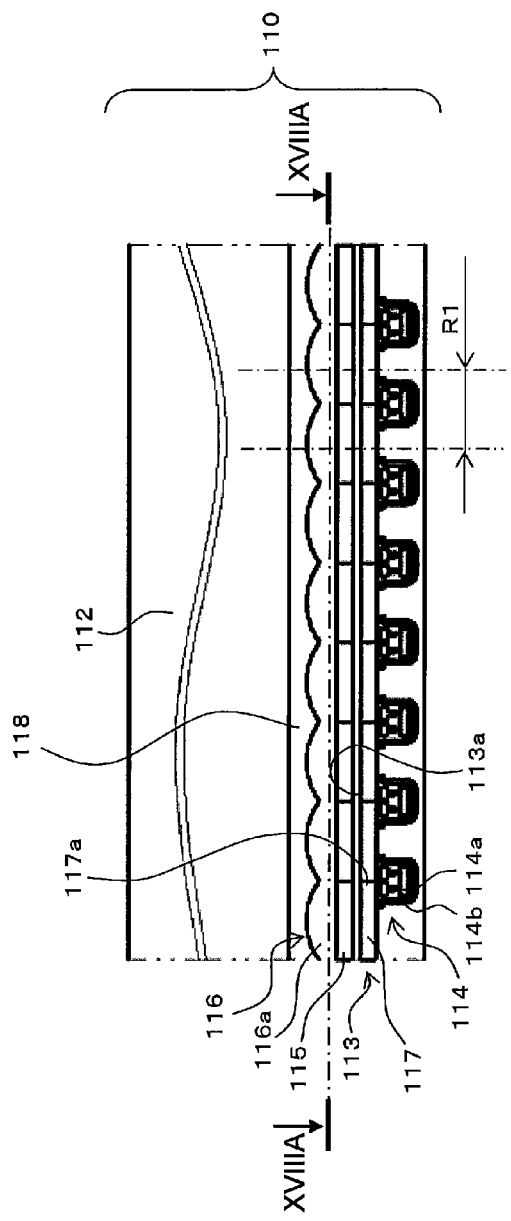
FIG. 17A is a simplified cross section of a first imaging element.
Figure 17B:
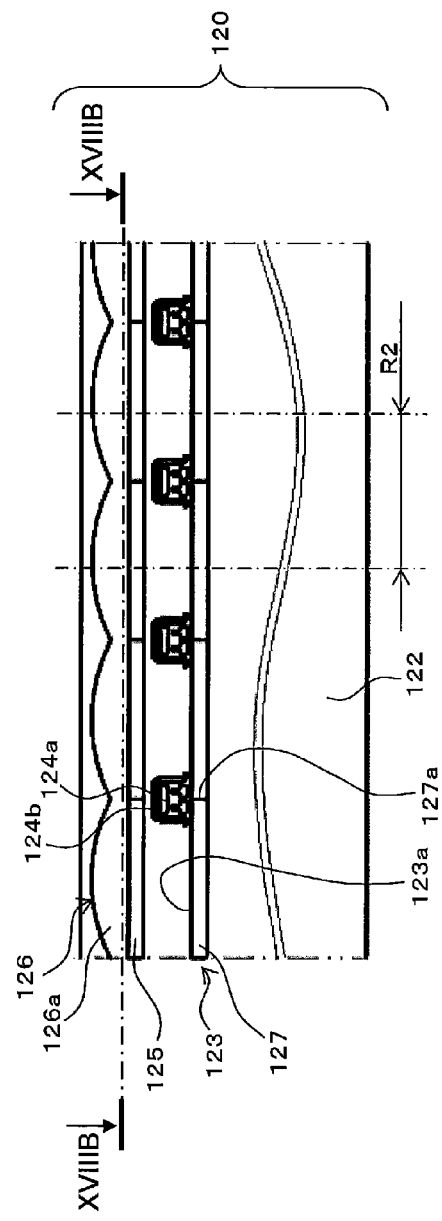
FIG. 17B is a simplified cross section of a second imaging element (second embodiment)
Figure 18A:
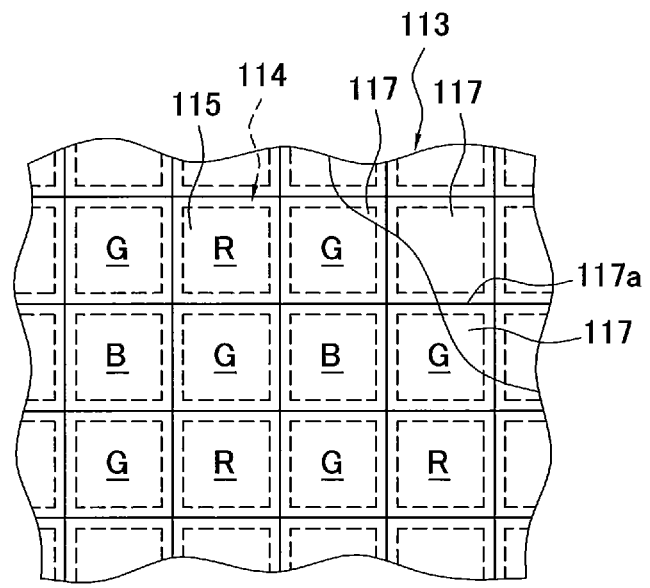
FIG. 18A is a cross section along the XVIIIA-XVIIIA line in FIG. 16.
Figure 18B:
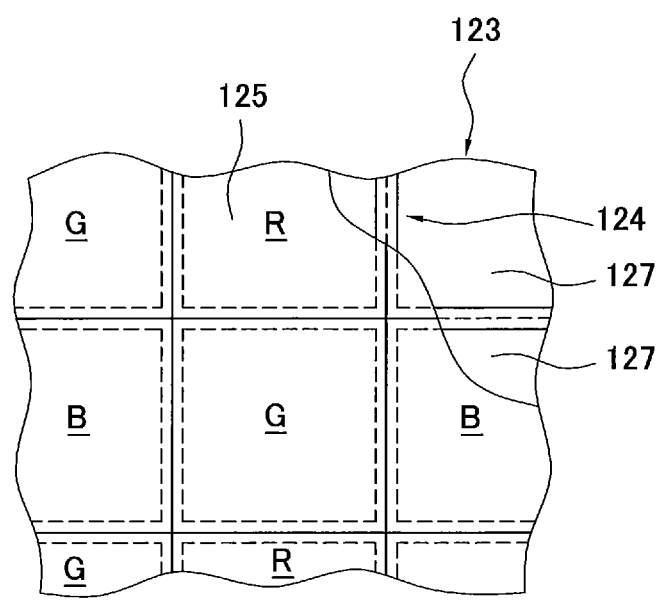
FIG. 18B is a cross section along the XVIIIB-XVIIIB line in FIG. 16.

More specifically, as shown in FIGS. 14 and 15, the first evaluation value calculator 51a calculates the first evaluation value EV1 and the second evaluation value calculator 51b calculates the second evaluation value EV2 in a state in which image data has been acquired at a specific frame rate by the first imaging element 110 and the second imaging element 120 (S31). Next, the state determination section 53 determines whether the first evaluation value EV1 and second evaluation value EV2 have increased or decreased (S32 and S33). More specifically, the first evaluation value determination section 52a produces a first determination result indicating the increase or decrease in the first evaluation value EV1 on the basis of the first evaluation value EV1 calculated in step S31. Also, the second evaluation value determination section 52b produces a second determination result indicating the increase or decrease in the second evaluation value EV2 on the basis of the second evaluation value EV2 calculated in step S31.

Further, the state determination section 53 determines whether or not the first evaluation value EV1 is decreasing on the basis of the first determination result (S32). If the first evaluation value EV1 is not decreasing, the subject is in focus, so calculation of the first evaluation value EV1 and the second evaluation value EV2 is repeated (S32 and S31). On the other hand, if the first evaluation value EV1 is decreasing, the subject is out of focus because the imaging conditions have changed or for some other such reason (J1 in FIG. 14). Therefore, the state determination section 53 determines whether or not the second evaluation value EV2 is decreasing on the basis of the second determination result in order to decide the drive direction of the focus lens L (S33).

If the second evaluation value EV2 is decreasing, the focused position FP is considered to be in the pre-focal state, so the state determination section 53 decides that the drive direction of the focus lens L is the D2 direction (J2 in FIG. 14). If the second evaluation value EV2 is increasing, the focused position FP is considered to be in the first post-focal state, so the state determination section 53 decides that the drive direction of the focus lens L is the D1 direction (J3 in FIG. 14). After step S33, focused position computation is performed by the focus computer 54 (S34A). The relation between the amount of change in the first evaluation value EV1 and the drive direction and required drive amount of the focus lens L is stored ahead of time in the ROM 10b of the body controller 10. Therefore, in the focused position computation, this relation is used by the focus computer 54 to calculate the target position of the focus lens L (J4 and J5 in FIG. 14) on the basis of the first evaluation value EV1 (S34A).

After focused position computation, drive of the focus lens L in the D2 direction is begun (S35A). When the focus lens L reaches the target position, drive of the focus lens L is stopped by the focus drive controller 41 (S36A and S37A). As a result, the focus lens L can be driven to a position corresponding to a focused state, and the subject comes back into focus.

On the other hand, if the second evaluation value EV2 is increasing, the focused position FP is considered to be in the first post-focal state, and the state determination section 53 decides the drive direction of the focus lens L to be the D1 direction. After step S33, focused position computation is performed by the focus computer 54 (S34B). After focus computation, drive of the focus lens L in the D2 direction is begun (S35B), and when the focus lens L reaches the target position, drive of the focus lens L is stopped (S36B and S37B). As a result, the focus lens L can be driven to a position corresponding to a focused state, and the subject comes back into focus (J6 and J7 in FIG. 14).

After steps S37A and S37B, the above-mentioned processing is repeated from step S31. Consequently, even if the focus is lost, it is automatically readjusted, so a focused state is maintained.

FIGS. 16A and 16B show a case in which a single imaging element is used as a reference example, and in this case, the system decides the direction in which the focus is off by subjecting the focus lens to minute reciprocal motion called wobbling, and comparing the AF evaluation values. Re-focusing can also be accomplished by adding in contrast AF by the hill climbing method (FIG. 16A), or by continuing the wobbling.

However, as can be seen from FIGS. 16A and 16B, this method takes 11 to 12 frames from the time the focus is lost until it is readjusted. If the frame rate of this imaging element is 30 fps, it can be seen that the operation will take approximately 400 msec, and that approximately 200 msec will be required even at a frame rate of 60 fps.

On the other hand, as shown in FIG. 14, the continuous AF mentioned above only takes five frames from the time the focus is lost until it is readjusted, so at a frame rate of 30 fps, re-focusing can be achieved in approximately 166 msec, and at a frame rate of 60 fps, re-focusing can be achieved in just 83 msec.

As above, the re-focusing time can be greatly shortened with continuous AF by using two imaging elements in continuous AF. Since there is no need for wobbling drive, there is no image flicker attributable to movement of the focus lens L. Furthermore, in the optical design there is less restriction to minimize the change in image magnification of the focus lens L, which affords greater design latitude. Therefore, the optical system O can be smaller.

Features

As described above, this digital camera 1 comprises the first imaging element 110 and the second imaging element 120, so two sets of image data (first image data and second image data) can be acquired at the same timing. In addition to the first evaluation value EV1 calculated from the first image data, the second evaluation value EV2 calculated from the second image data is used in an auxiliary capacity, which improves the reliability of the AF evaluation value. Therefore, the time it takes to determine a change in an AF evaluation value with contrast AF can be shortened, which allows for faster focal point detection.

The positional relation between the focused position FP, the first imaging face 113a of the first opto-electrical converter 113, and the second imaging face 123a of the second opto-electrical converter 123 can be determined on the basis of the increase or decrease in the first evaluation value EV1 calculated from the first image data and the increase or decrease in the second evaluation value EV2 calculated from the second image data. Therefore, the correct drive direction for the focus lens L can be quickly determined on the basis of the first evaluation value EV1 and the second evaluation value EV2, and this allows for even faster focal point detection.

Second Embodiment

A second embodiment will now be described. Those components that have substantially the same function as in the first embodiment discussed above will be numbered the same and not described again in detail.

In the first embodiment above, the second imaging element 120 has no color filter, but the second imaging element 120 may have a second color filter 125. For example, as shown in FIGS. 17A, 17B, 18A, and 18B, the second color filter 125 is a primary color filter with a Bayer arrangement, and is disposed on the incident side of the second opto-electrical converter 123. The second color filter 125 has a plurality of red filters R, a plurality of green filters G, and a plurality of blue filters B. The red filters R have higher transmissivity in the red visible light wavelength band than the visible light wavelength bands of colors other than red. The green filters G have higher transmissivity in the green visible light wavelength band than the visible light wavelength bands of colors other than green. The blue filters B have higher transmissivity in the blue visible light wavelength band than the visible light wavelength bands of colors other than blue.

The red filters R, green filters G, and blue filters B are disposed in a matrix. More specifically, a single set with two rows and two columns consists of a red filter R, two green filters G, and a blue filter B, and these sets are disposed in a matrix. Among the filters in a set, the two green filters G are disposed in diagonally opposite corners. In this embodiment, one filter is disposed at a location corresponding to one second opto-electrical element 127. The second color filter 125 may also be a complementary color filter.

The red filters R, green filters G, and blue filters B of the second color filter 125 have the same size as the four first opto-electrical conversion elements 117, just as with the second opto-electrical elements 127. Therefore, light that has passed through one red filter R, one blue filter B, and two green filters G of the first color filter 115 is incident on the one red filter R, one blue filter B, and two green filters G of the second color filter 125. Consequently, only one color of light is incident on one of the second opto-electrical elements 127.

Using this second imaging element 120 has the same effect as in the first embodiment.

Third Embodiment

A third embodiment will now be described. Those components that have substantially the same function as in the first and second embodiments discussed above will be numbered the same and not described again in detail.

In the first and second embodiments above, the first imaging element 110 and the second imaging element 120 no not move relatively in a direction parallel to the optical axis AZ, but the first imaging element 110 and the second imaging element 120 may be disposed so that they can move relative to each other.

Features

Figure 19:
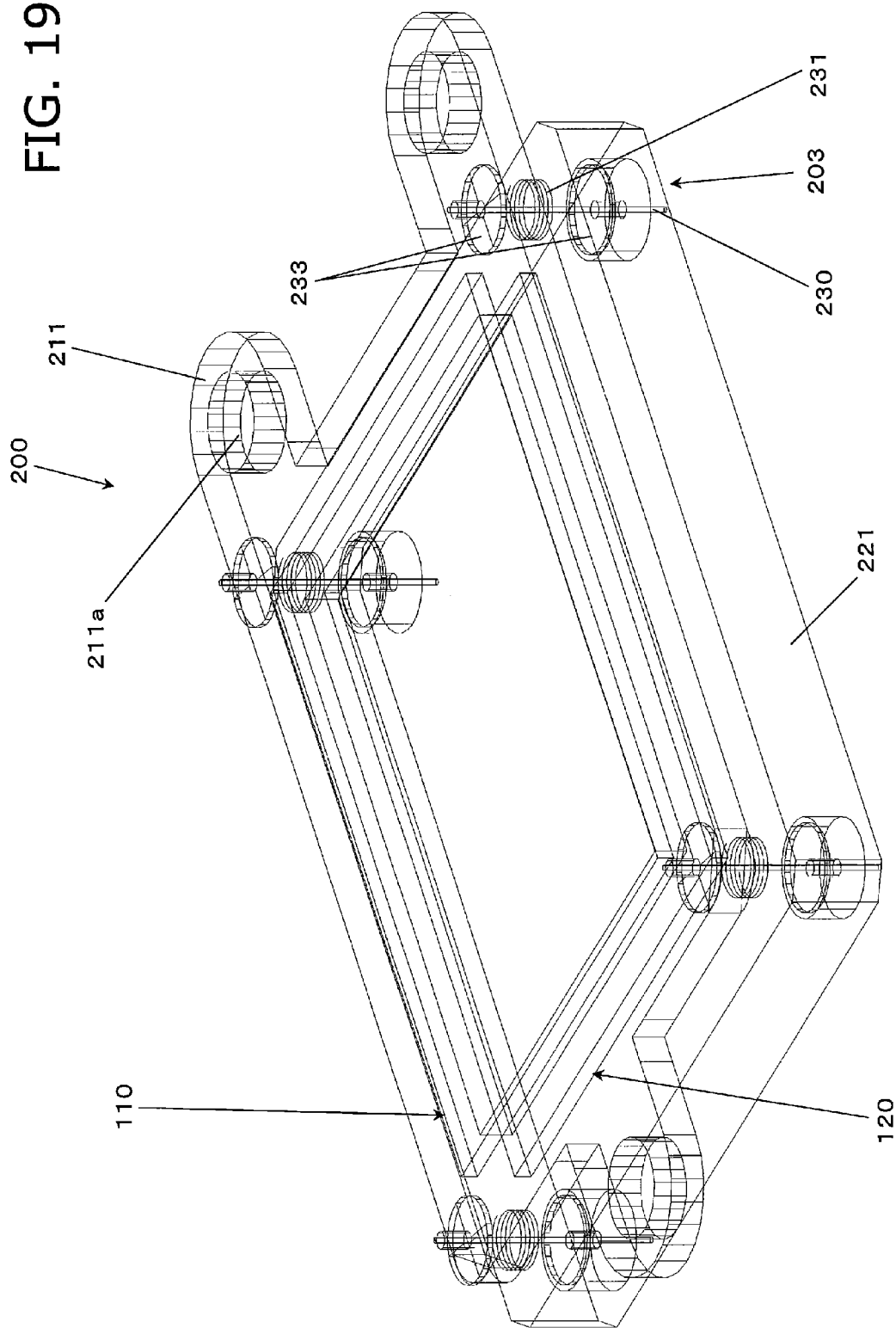
FIG. 19 is a simplified oblique view of an imaging element unit (third embodiment)
Figure 20:
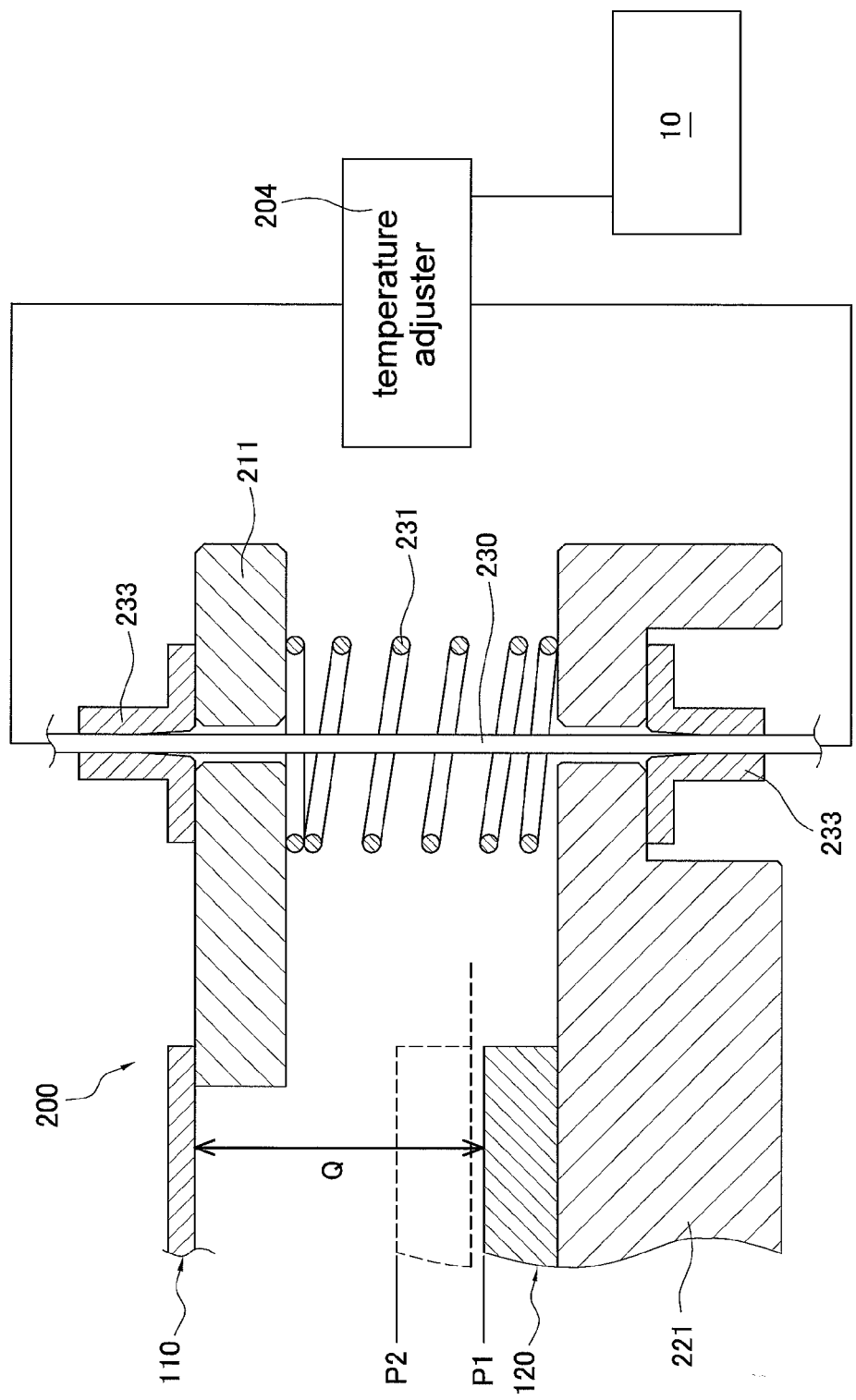
FIG. 20 is a simplified oblique view of an imaging element unit (third embodiment)

As shown in FIGS. 19 and 20, for example, an imaging element unit 200 pertaining to the third embodiment comprises the first imaging element 110, the second imaging element 120, a first package 211, a second package 221, an adjusting mechanism 203, and a temperature adjuster 204.

The first package 211 supports the first imaging element 110, and is fixed to a housing (not shown). The first imaging element 110 is fixed to the first package 211.

The second package 221 supports the second imaging element 120, and is linked by the adjusting mechanism 203 to the first package 211. The second imaging element 120 is fixed to the second package 221.

The adjusting mechanism 203 links the first package 211 and the second package 221, and adjusts the distance between the first imaging element 110 and the second imaging element 120. More specifically, the adjusting mechanism 203 has four linking wires 230, four first fixing bushing 233, four second fixing bushings 234, and four biasing springs 231.

The four first fixing bushing 233 link the first package 211 to the linking wires 230, and are fixed to the first package 211 and the linking wires 230. The four second fixing bushings 234 link the second package 221 to the linking wires 230, and are fixed to the first package 211 and the second package 221.

The linking wires 230 are formed from what is known as a shape memory alloy. The coefficient of linear expansion of the linking wires 230 (one example of a linear member) is much greater than that of the second package 221, the first fixing bushing 233, and the second fixing bushings 234. The four linking wires 230 are electrically connected to the temperature adjuster 204. The temperature adjuster 204 adjusts the temperature of the linking wires 230 by sending current to the linking wires 230, and freely varies the length of the linking wires 230. In this embodiment, if we let the normal position of the second imaging element 120 be the position P1 shown in FIG. 20, then the second imaging element 120 is driven by the temperature adjuster 204 to a position P2 on the first imaging element 110 side.

The four biasing springs 231 are sandwiched between the first package 211 and the second package 221, and press on the first package 211 and the second package 221 so that the first package 211 and the second package 221 move away from each other. The linking wires 230 are inserted into the biasing springs 231 (one example of an adjustment mechanism). Since the first package 211 and the second package 221 are linked by the linking wires 230 in a direction parallel to the optical axis AZ, the elastic force of the biasing springs 231 keeps the relative positions of the first package 211 and the second package 221 stable. Also, if the length of the linking wires 230 changes, the distance Q between the first package 211 and the second package 221 changes according to the change in length. Since the biasing springs 231 expand and contract according to the change in the distance Q, the relative positions of the first package 211 and the second package 221 can be kept stable while the distance Q is varied.

The temperature adjuster 204 varies the current sent to the linking wires 230. The output of the temperature adjuster 204 is controlled by the body controller 10.

Operation

Figure 21:
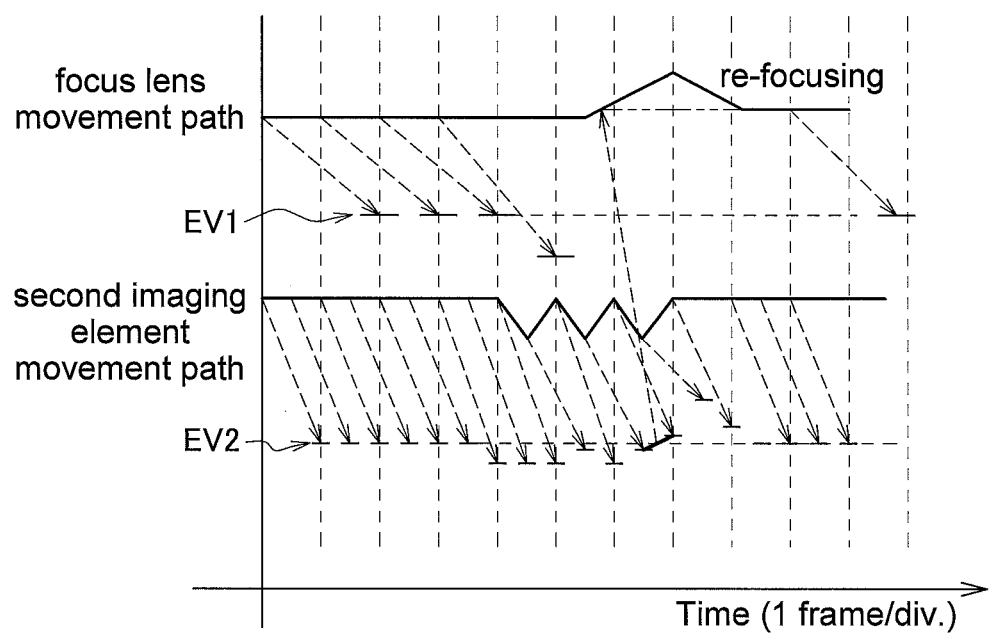
FIG. 21 is a time chart (third embodiment)

The operation of the imaging element unit 200 described above will now be described using continuous AF mode as an example, through reference to FIGS. 21 to 23.

Figure 22:
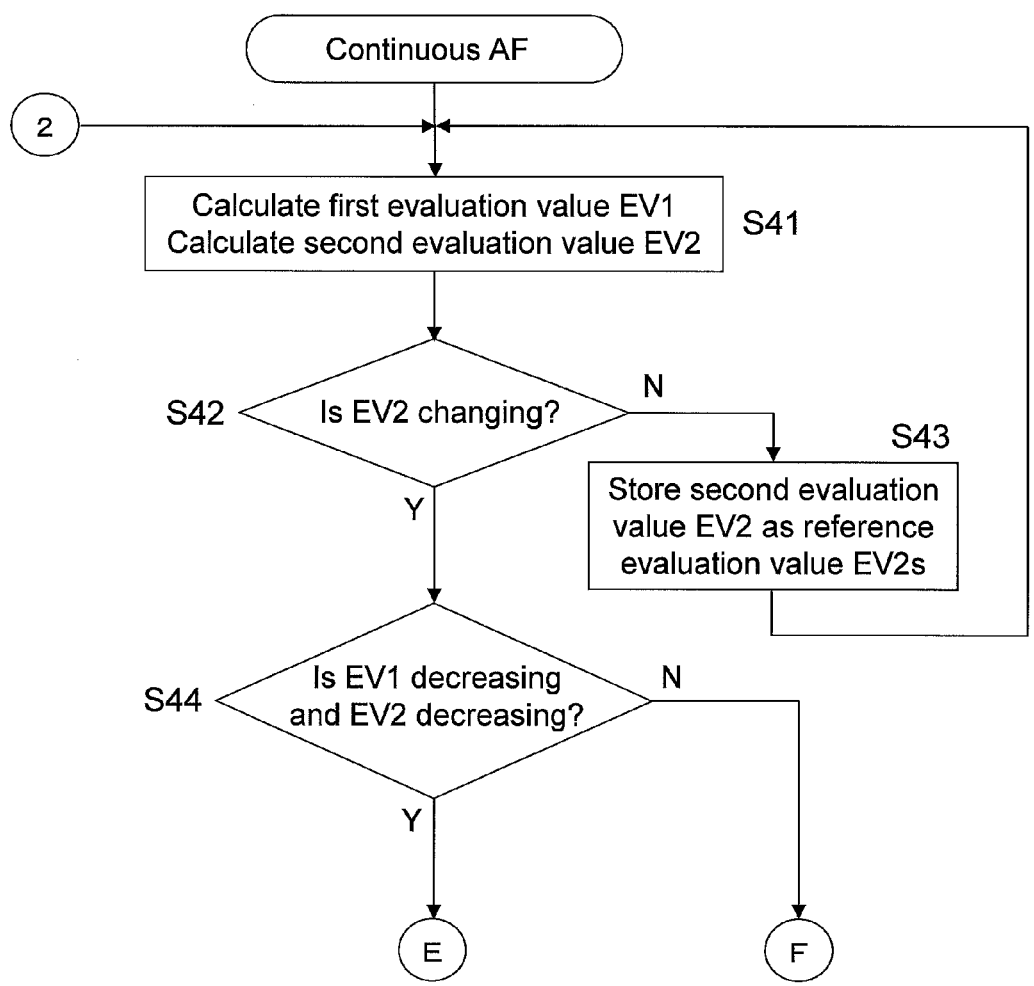
FIG. 22 is a flowchart (third embodiment)
Figure 23:
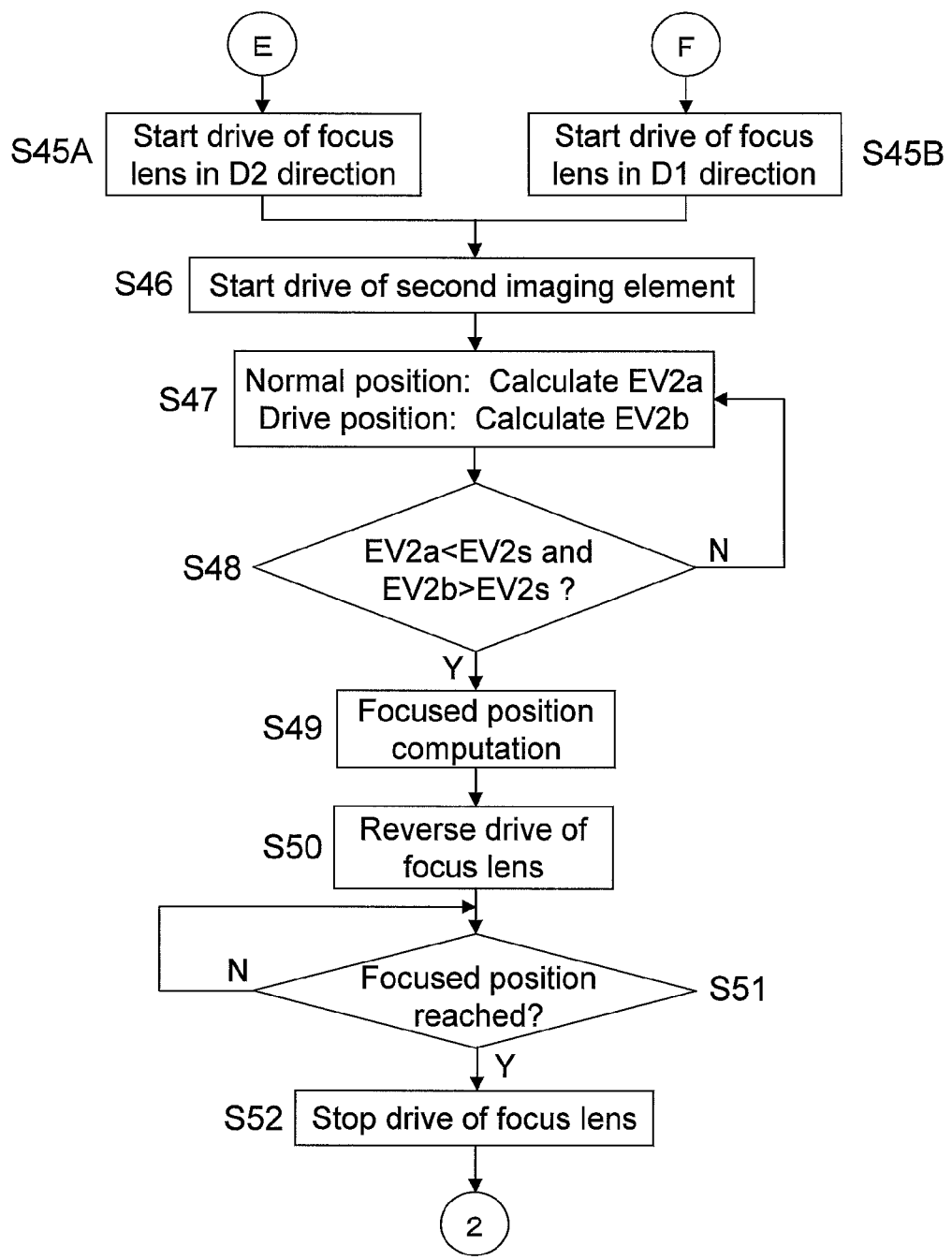
FIG. 23 is a flowchart (third embodiment)

As shown in FIG. 22, in a state in which image data is being acquired at a specific frame rate by the first imaging element 110 and the second imaging element 120, the first evaluation value EV1 is calculated by the first evaluation value calculator 51a, and the second evaluation value EV2 is calculated by the second evaluation value calculator 51b (S41). In this embodiment, as shown in the time chart in FIG. 21, the frame rate of the second imaging element 120 is twice the frame rate of the first imaging element 110. Therefore, while one first evaluation value EV1 is being calculated, two second evaluation values EV2 are calculated.

Since the calculation period of the second evaluation value EV2 is half the calculation period of the first evaluation value EV1, it is preferable if the increase or decrease in the second evaluation value EV2 is used to determine whether or not the image is out of focus. Therefore, as shown in FIG. 22, it is determined whether or not the second evaluation value EV2 has changed (S42). More specifically, the second determination result is produced by the second evaluation value determination section 52b on the basis of the second evaluation value EV2. If the second evaluation value EV2 is constant, the calculated second evaluation value EV2 is stored as a reference evaluation value EV2 in the RAM 10a of the body controller 10 (S43), and steps S41 and S42 are repeated.

On the other hand, if the second evaluation value EV2 has changed, the state determination section 53 determines whether or not the first evaluation value EV1 and the second evaluation value EV2 are both decreasing (S44). More specifically, the drive direction of the focus lens L is determined by the state determination section 53 on the basis of the first determination result produced by the first evaluation value determination section 52a and the second determination result produced by the second evaluation value determination section 52b.

If the first evaluation value EV1 and the second evaluation value EV2 are both decreasing, the focused position FP is changing from a focused state to a pre-focal state, so the state determination section 53 decides the drive direction to be the D2 direction (S44 and S45A). On the other hand, if the first evaluation value EV1 and the second evaluation value EV2 are not both decreasing, the focused position FP is changing from a focused state to a first post-focal state, so the state determination section 53 decides the drive direction to be the D1 direction (S44 and S45B). In steps S45A and S45B the focus lens L is driven in the decided drive direction (S45A and S45B).

After this, drive of the second imaging element 120 is begun (S46). More specifically, the temperature of the linking wires 230 is adjusted by the temperature adjuster 204, and reciprocal motion between the normal position P1 and the drive position P2 is repeated for a specific period. The period in which the second imaging element 120 goes from the normal position P1, through the drive position P2, and returns to the normal position P1 is set to be the same as the frame rate of the first imaging element 110. For instance, the temperature adjuster 204 utilizes a timing signal sent from the first timing generator 12a to the body controller 10 in order to synchronize the reciprocal motion of the second imaging element 120 with the frame rate of the first imaging element 110.

In a state in which the second imaging element 120 is being reciprocally driven, the second evaluation value calculator 51b calculates the second evaluation values EV2 corresponding to the normal position P1 and the drive position P2 (S47). The second evaluation value EV2 corresponding to the normal position P1 is stored in the RAM 10a as a second evaluation value EV2a, and the second evaluation value EV2 corresponding to the drive position P2 is stored in the RAM 10a as a second evaluation value EV2b.

If the second evaluation value EV2a is less than a reference evaluation value EV2s, and the second evaluation value EV2b is greater than the reference evaluation value EV2s, it means that the position of the second imaging element 120 at which the second evaluation value EV2 corresponds to a focused position is in between the normal position P1 and the drive position P2. If this position can be specified, then the amount of drive of the focus lens L needed to attain a focused state using this position as a reference can be calculated. Therefore, if the above condition is met in step S48, focused position computation is performed by the focus computer 54 (S48 and S49). For example, the target position of the focus lens L can be calculated by calculating the position of the focus lens L corresponding to the reference evaluation value EV2s from the second evaluation values EV2a and EV2b.

On the other hand, if the above condition is not met, then calculation of the second evaluation values EV2a and EV2b is repeated (S48 and S47).

After focused position computation, the reverse drive of the focus lens L in the D2 direction is begun (S50), and when the focus lens L reaches the target position, the drive of the focus lens L is stopped by the focus drive controller 41 (S51 and S52). As a result, the focus lens L can be driven to a position corresponding to a focused state, and the subject comes back into focus.

Thus, continuous AF can also be performed with the imaging element unit 200 with which the second imaging element 120 can be driven.

Other Embodiments

Embodiments of the present invention are not limited to what was given above, and various modifications and changes are possible without departing from the gist of the present invention. Also, the above embodiments are basically just preferable examples, and the present invention, its applications, and the scope of those applications are not intended to be limited by these embodiments.

(1) In the above embodiments, the digital camera was able to capture both still pictures and moving pictures, but may instead be able to capture only still pictures.

(2) The technology discussed above can be applied to any imaging device having a focusing function. Examples of such imaging devices include digital still cameras (including digital cameras with interchangeable lenses), digital video cameras, portable telephones with a camera function, and PDA's with a camera function.

(3) The digital camera 1 discussed above has not quick-return mirror, but a quick-return mirror may be installed as in a conventional digital single lens reflex camera.

Figure 24:
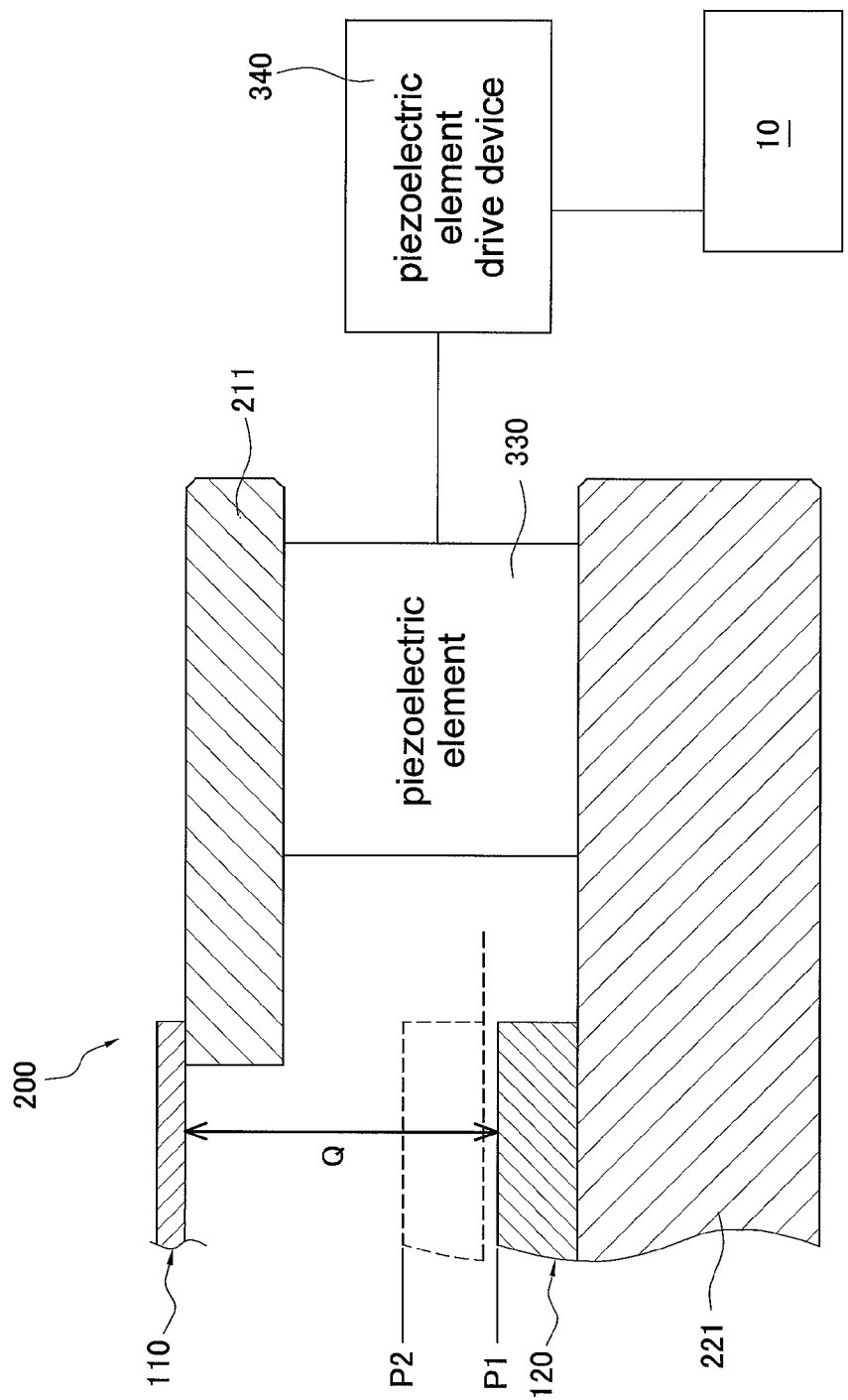
FIG. 24 is a simplified cross section of an imaging element unit (other embodiment).

(4) In the third embodiment above, the second imaging element 120 is driven by using the linking wires 230 and the biasing springs 231, but how the second imaging element 120 is driven is not limited to this. For example, a piezoelectric element 330 (another example of adjustment mechanism) may be used as shown in FIG. 24. In this case, the piezoelectric element 330 is sandwiched between the first package 211 and the second package 221. Also, a piezoelectric element drive device 340 is provided for driving the piezoelectric element 330.

General Interpretation of Terms

In understanding the scope of the present disclosure, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including" "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of an imaging device. Accordingly, these terms, as utilized to describe the present invention should be interpreted relative to an imaging device.

The term "configured" as used herein to describe a component, section or part of a device includes hardware and/or software that is constructed and/or programmed to carry out the desired function.

The terms of degree such as "substantially", "about" and "approximately" as used herein mean a reasonable amount of deviation of the modified term such that the end result is not significantly changed.

The phrase "focal point detection" as used herein encompasses defocus determination, deciding the drive direction of the focus lens, specifying the position of the focus lens corresponding to the focal state, and other such operations.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:
1. An imaging device comprising:
a first imaging element including a first opto-electrical converter configured to convert light into an electrical signal;
a second imaging element configured and arranged to receive light incident on and passing through the first opto-electrical converter, the second imaging element including a second opto-electrical converter configured to convert the light coming from the first opto-electrical converter into an electrical signal; and
a focal point detector configured to perform focal point detection based on first image data obtained by the first imaging element and second image data obtained by the second imaging element;
wherein the focal point detector includes a first calculator configured to calculate a first evaluation value based on a spatial frequency component of the first image data, and a second calculator configured to calculate a second evaluation value based on a spatial frequency component of the second image data.

2. The imaging device according to claim 1, wherein
the focal point detector further includes a first determination section configured to determine a change in the magnitude of the first evaluation value and produce a first determination result based on whether the first evaluation value has increased or decreased, and a second determination section configured to determine a change in the magnitude of the second evaluation value and produce a second determination result based on whether the second evaluation value has increased or decreased.

3. The imaging device according to claim 2, wherein
the focal point detector includes a state determination section configured to determine the relative position between the first opto-electrical converter and the imaging position of light incident on the first opto-electrical converter based on the first determination result and the second determination result.

4. The imaging device according to claim 2, wherein
a state determination section is configured to determine the relative position between the second opto-electrical converter and the imaging position of light incident on the first opto-electrical converter based on the first determination result and the second determination result.

5. The imaging device according to claim 2, further comprising
an optical system including a focus lens, the optical system being configured to form an optical image of a subject, wherein
the focal point detector further includes a focus prediction unit configured to predict a target position of the focus lens which corresponds to when the optical image is in focus, the target position being based on the second determination result and identified before a maximum value of the first evaluation value is detected.

6. The imaging device according to claim 5, wherein
the focus prediction unit is further configured to predict the target position using a maximum value of the second evaluation value as a reference.

7. The imaging device according to claim 1, wherein
the first imaging element further includes a first circuit portion disposed between the first opto-electrical converter and the second opto-electrical converter, the first circuit portion being configured to receive electrical signals produced by the first opto-electrical converter.

8. The imaging device according to claim 1, wherein
the second imaging element further includes a second circuit portion disposed between the first opto-electrical converter and the second opto-electrical converter, the second imaging element being configured to receive electrical signals produced by the second opto-electrical converter.

9. The imaging device according to claim 1, wherein
the first imaging element further includes a first micro-lens disposed on the opposite side of the first opto-electrical converter from the second imaging element, and a first color filter disposed between the first opto-electrical converter and the first micro-lens.

10. The imaging device according to claim 1, wherein
the first opto-electrical converter includes a plurality of first opto-electrical conversion elements configured and arranged to receive light having two or more colors.

11. The imaging device according to claim 1, wherein
the second imaging element includes a second color filter disposed between the second opto-electrical converter and the first imaging element.

12. The imaging device according to claim 1, wherein
the second imaging element further includes a second micro-lens disposed between the second opto-electrical converter and the first imaging element, the second imaging element being configured and arranged to collect light that passes through the first opto-electrical converter and radiates towards the second opto-electrical converter.

13. An imaging device comprising:
a first imaging element including a first opto-electrical converter configured to convert light into an electrical signal;
a second imaging element configured and arranged to receive light incident on and passing through the first opto-electrical converter, the second imaging element including a second opto-electrical converter configured to convert the light coming from the first opto-electrical converter into an electrical signal; and
a focal point detector configured to perform focal point detection based on first image data obtained by the first imaging element and second image data obtained by the second imaging element;
wherein each of the first opto-electrical converter and the second opto-electrical converter has a pixel pitch, the pixel pitch of the second opto-electrical converter greater than the pixel pitch of the first opto-electrical converter.

14. The imaging device according to claim 1, further comprising
an adjustment mechanism configured to regulate the distance between the first imaging element and the second imaging element.

15. The imaging device according to claim 14, wherein
the adjustment mechanism includes at least one linear member that couples the first imaging element to the second imaging element, a biasing member that presses against the first imaging element and the second imaging element to urge the first and second imaging elements away from each other, and a temperature adjuster configured to adjust the temperature of the linear member.

16. The imaging device according to claim 14, wherein
the adjustment mechanism includes a piezoelectric element coupled to the first imaging element and the second imaging element and configured to regulate the distance therein between.

17. The imaging device according to claim 1, wherein
each of the first imaging element and the second imaging element has a frame rate, the frame rate of the second imaging element is less than the frame rate of the first imaging element.

18. The imaging device according to claim 1, further comprising:
an adjustment mechanism that couples the first imaging element to the second imaging element and is configured to regulate the distance therein between.

* * * * *